US012272399B1

(12) United States Patent  
Nazarian

(10) Patent No.: US 12,272,399 B1  
(45) Date of Patent: *Apr. 8, 2025

(54) DIFFERENTIAL PROGRAMMING OF TWO-TERMINAL RESISTIVE SWITCHING MEMORY WITH PROGRAM SOAKING AND ADJACENT PATH DISABLEMENT

(71) Applicant: Crossbar, Inc., Santa Clara, CA (US)

(72) Inventor: Hagop Nazarian, Danville, CA (US)

(73) Assignee: Crossbar, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/587,443

(22) Filed: Feb. 26, 2024

Related U.S. Application Data

(63) Continuation of application No. 17/710,835, filed on Mar. 31, 2022, now Pat. No. 12,080,347.

(51) Int. Cl.
*G11C 13/00* (2006.01)

(52) U.S. Cl.
CPC ...... *G11C 13/0069* (2013.01); *G11C 13/0026* (2013.01); *G11C 13/0028* (2013.01); *G11C 13/0038* (2013.01); *G11C 13/004* (2013.01)

(58) Field of Classification Search
CPC ............ G11C 13/0069; G11C 13/0026; G11C 13/0028; G11C 13/0038; G11C 13/004
USPC ...................................................... 365/148
See application file for complete search history.

(56) References Cited

U.S. PATENT DOCUMENTS

| | | | |
|---|---|---|---|
| 7,006,373 B2 | 2/2006 | Hidaka | |
| 7,672,155 B2 | 3/2010 | Kim et al. | |
| 9,520,173 B1 * | 12/2016 | Baker, Jr. | G11C 11/16 |
| 10,692,575 B1 * | 6/2020 | Huang | G11C 13/003 |
| 12,080,347 B1 * | 9/2024 | Nazarian | G11C 13/0069 |
| 2002/0039309 A1 * | 4/2002 | Lu | G11C 11/15 365/158 |

(Continued)

FOREIGN PATENT DOCUMENTS

CN 114187945 3/2022

OTHER PUBLICATIONS

International Search Report and Written Opinion for International Application No. PCT/US2023/065178 dated Jul. 24, 2023, 7 pages.

(Continued)

*Primary Examiner* — Fernando Hidalgo  
(74) *Attorney, Agent, or Firm* — Wegman Hessler Valore

(57) ABSTRACT

Differential programming of multiple resistive switching memory cells defining a bit is disclosed. The differential programming can mitigate invalid data values for the defined bit, referred to herein as an identifier bit. Embodiments of the present disclosure provide for detection of a program event(s) for a portion of resistive switching memory cells defining an identifier bit, and disconnecting a remainder of the memory cells from program supply voltage, prior to a duration of a program cycle. Additionally, the program cycle can be continued for the programmed memory cell(s) to facilitate a robust programming and enhance data longevity. The detection and subsequent disconnection can facilitate proper differential programming and mitigate unwanted program events that lead to invalid identifier bit results, as well as reducing power consumption for a program cycle of resistive switching memory.

20 Claims, 15 Drawing Sheets

(56) References Cited

U.S. PATENT DOCUMENTS

| | | | |
|---|---|---|---|
| 2007/0058425 A1 | 3/2007 | Cho et al. | |
| 2007/0247940 A1 | 10/2007 | Liaw et al. | |
| 2008/0137436 A1 | 6/2008 | Salter | |
| 2011/0299340 A1 | 12/2011 | Samachisa et al. | |
| 2012/0320658 A1* | 12/2012 | Wang | G11C 14/0054 365/148 |
| 2014/0269008 A1* | 9/2014 | Baker, Jr. | G11C 13/0069 365/148 |
| 2014/0321193 A1 | 10/2014 | Park | |
| 2015/0269993 A1* | 9/2015 | Shieh | G11C 13/0069 365/148 |
| 2016/0133325 A1 | 5/2016 | Lan et al. | |
| 2016/0284403 A1 | 9/2016 | Navon et al. | |
| 2019/0287612 A1* | 9/2019 | Lin | G11C 13/004 |
| 2019/0341107 A1 | 11/2019 | Bertin | |
| 2021/0201997 A1 | 7/2021 | Yuh et al. | |
| 2022/0036949 A1 | 2/2022 | Asnaashari et al. | |
| 2022/0084592 A1* | 3/2022 | Tamura | G11C 13/0064 |
| 2022/0375536 A1 | 11/2022 | Strachan et al. | |
| 2023/0138195 A1* | 5/2023 | Park | G06F 3/0619 711/154 |

OTHER PUBLICATIONS

Ex Parte Quayle action for U.S. Appl. No. 17/710,858 dated Oct. 3, 2023, 8 pages.

Notice of Allowance for U.S. Appl. No. 17/710,835 dated Oct. 18, 2023, 8 pages.

Notice of Allowance for U.S. Appl. No. 17/710,858 dated Jan. 31, 2024, 8 page.

Notice of Allowance for U.S. Appl. No. 17/710,835 dated Apr. 9, 2024, 10 pages.

Notice of Allowance for U.S. Appl. No. 17/710,809 dated May 24, 2024, 19 pages.

Non-Final Office for U.S. Appl. No. 17/895,129 dated Apr. 26, 2024, 19 pages.

Notice of Allowance for U.S. Appl. No. 17/710,858 dated Aug. 1, 2024, 15 page.

Notice of Allowance for U.S. Appl. No. 17/895,129 dated Sep. 5, 2024, 19 page.

* cited by examiner

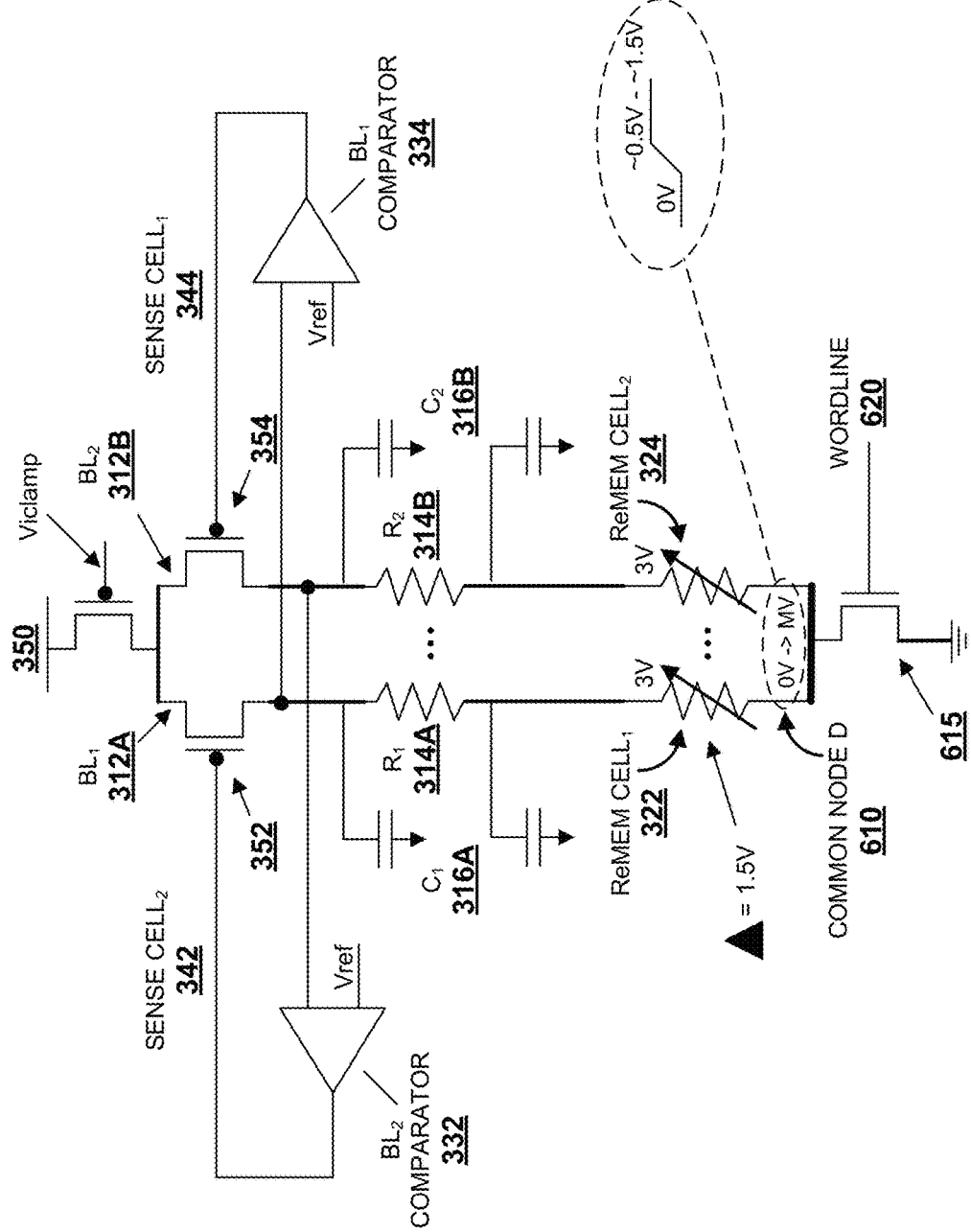

FROM FIG. 10 AT 1016

1000 cont.

1018 IN RESPONSE TO DETECTING A PROGRAM EVENT FOR THE FIRST MEMORY CELL, DEACTIVATE THE SECOND TRANSISTOR

1020 DISCONNECT THE PROGRAM VOLTAGE FROM THE SECOND MEMORY CELL IN RESPONSE TO DEACTIVATION OF THE SECOND TRANSISTOR

FROM FIG. 10 AT 1016

1022 IN RESPONSE TO DETECTING A PROGRAM EVENT FOR THE SECOND MEMORY CELL, DEACTIVATE THE FIRST TRANSISTOR

1024 DISCONNECT THE PROGRAM VOLTAGE FROM THE FIRST MEMORY CELL IN RESPONSE TO DEACTIVATION OF THE FIRST TRANSISTOR

1026 CONTINUE APPLYING THE PROGRAM SIGNAL FOR A PROGRAM CYCLE DURATION

1028 TERMINATE THE PROGRAM SIGNAL; DISCONNECT THE COMMON NODE FROM LOW VOLTAGE

1030 DESIGNATE EITHER THE FIRST OR THE SECOND MEMORY CELL AS STORING A STATE OF THE PUF BIT

1032 OPTIONALLY RE-ALLOCATE THE SECOND OR FIRST MEMORY CELL, RESPECTIVELY FOR OTHER DATA

FIG. 10A

DIFFERENTIAL PROGRAMMING OF TWO-TERMINAL RESISTIVE SWITCHING MEMORY WITH PROGRAM SOAKING AND ADJACENT PATH DISABLEMENT

CROSS REFERENCE TO RELATED APPLICATION

The present application for patent is a continuation of and claims priority to U.S. patent application Ser. No. 17/710,835 filed Mar. 31, 2022, and titled DIFFERENTIAL PROGRAMMING OF TWO-TERMINAL RESISTIVE SWITCHING MEMORY WITH PROGRAM SOAKING AND ADJACENT PATH DISABLEMENT, which is hereby incorporated by reference in its entirety and for all purposes.

INCORPORATION BY REFERENCE

U.S. patent application Ser. No. 17/708,491 filed Mar. 31, 2022, and titled "DYNAMIC HOST ALLOCATION OF PHYSICAL UNCLONABLE FEATURE OPERATION FOR RESISTIVE SWITCHING MEMORY", U.S. patent application Ser. No. 17/710,809 filed Mar. 31, 2022, and titled "DIFFERENTIAL PROGRAMMING OF TWO-TERMINAL RESISTIVE SWITCHING MEMORY WITH INTRINSIC ERROR SUPPRESSION", and U.S. patent application Ser. No. 17/223,817 filed Apr. 6, 2021, and titled "DISTINCT CHIP IDENTIFIER SEQUENCE UTILIZING UNCLONABLE CHARACTERISTICS OF RESISTIVE MEMORY ON A CHIP" are hereby incorporated by reference herein in their respective entireties and for all purposes.

TECHNICAL FIELD

The subject disclosure relates generally to two-terminal resistive switching memory, and as one illustrative example, differential programming of multiple two-terminal resistive switching memory that detects a program event in one cell and disconnects the second cell from a voltage source.

BACKGROUND

Resistive-switching memory represents a recent innovation within the field of integrated circuit technology. While much of resistive-switching memory technology is in the development stage, various technological concepts for resistive-switching memory have been demonstrated and are in one or more stages of verification to prove or disprove associated theories or techniques. Resistive-switching memory technology is expected to show compelling evidence of substantial advantages over competing technologies in the semiconductor electronics industry in the near future.

Proposals for practical utilization of resistive-switching technology to memory applications for electronic devices have been put forth. For instance, resistive-switching elements are often theorized as viable alternatives, at least in part, to metal-oxide semiconductor (MOS) type memory transistors employed for electronic storage of digital information. Models of resistive-switching memory devices provide some potential technical advantages over non-volatile FLASH MOS type transistors, for instance.

In additional to memory elements, volatile resistive-switching elements have been proposed in conjunction with a MOS transistor for a high speed non-volatile memory device, or as a high-speed field actuated switch, or selector device. Still further, stochastic characteristics of resistive-switching structures have been proposed by the inventor as suitable for generating non-correlated data for random number generation, or similar applications. Each of these applications has met different needs for electronic memory applications or specialty data generation applications.

In light of the above, the Assignee of the present disclosure continues to develop and pursue practical utilizations of resistive-switching technology.

SUMMARY

The following presents a simplified summary of the specification in order to provide a basic understanding of some aspects of the specification. This summary is not an extensive overview of the specification. It is intended to neither identify key or critical elements of the specification nor delineate the scope of any particular embodiments of the specification, or any scope of the claims. Its purpose is to present some concepts of the specification in a simplified form as a prelude to the more detailed description that is presented in this disclosure.

Embodiments of the present disclosure provide improved differential programming of multiple two-terminal resistive switching memory cells that define a single identifier bit. In various embodiments, characteristics of resistive switching memory cells are leveraged by processes that produce highly non-correlated data relative to other identifier bits formed of different groups of resistive switching memory cells. An identifier bit as utilized herein refers to a unit of such non-correlated data produced from one or more resistive switching memory cells by way of a process(es) configured to leverage stochastic characteristic of the resistive switching memory cells. The name identifier bit is a functional appellation derived largely from the capacity of such bits to generate unique (and thus distinctly identifiable) data sequences. Identifier bits can include physical unclonable feature (PUF) bits (or physical unclonable function: also PUF bits), as well as random number generation (RNG) bits generated from non-native PUF processes or non-PUF processes, as described in more detail throughout this specification. In various disclosed embodiments, a programming process is described for generating a data value for an identifier bit by programming some—but not all—of a plurality of two-terminal resistive switching memory cells that define the identifier bit. Such a programming process is referred to herein as a differential programming process.

One or more aspects of the present disclosure provide differential programming that mitigates invalid identifier bit values. An invalid identifier bit value can occur when an unexpected number of memory cells defining the identifier bit become programmed as part of differential programming. Embodiments of the present disclosure provide for detection of a program event(s) for a portion of resistive switching memory cells defining an identifier bit, and suppression of programming of a remainder of the memory cells after detecting the program event(s). The detection and subsequent program suppression can facilitate proper differential programming and mitigate unwanted program events that lead to invalid identifier bit results.

In an embodiment, disclosed is an integrated circuit device. The integrated circuit device can comprise an array of two-terminal resistive switching memory. The array can further comprise a first bitline, a second bitline, a first two-terminal resistive switching memory comprising a first terminal electrically connected to the first bitline, and a second terminal, and further the array can comprise a second two-terminal resistive switching memory comprising a first terminal electrically connected to the second bitline, and a second terminal. Moreover, the integrated circuit device can comprise a voltage source, and a switch for selectively connecting or disconnecting the first bitline and the second bitline to or from the voltage source. In addition, the integrated circuit device can comprise a second switch for selectively connecting or disconnecting the second terminal of the first two-terminal resistive switching memory and the second terminal of the second two-terminal resistive switching memory to or from low voltage, or ground. Further, the integrated circuit device can comprise a detection circuit configured to detect a program event for the first two-terminal resistive switching memory or for the second two-terminal resistive switching memory. Still further, the integrated circuit device can comprise a termination circuit configured to at least one of: disconnect the first bitline from the voltage source in response to the detection circuit detecting the program event for the second two-terminal resistive switching memory, or disconnect the second bitline from the voltage source in response to the detection circuit detecting the program event for the first two-terminal resistive switching memory.

According to one or more further embodiments of the present disclosure, a method is provided. The method can comprise connecting a first terminal of a first two-terminal memory to a voltage source and connecting a second terminal of the first two-terminal memory to the voltage source, wherein the first two-terminal memory and the second two-terminal memory define an identifier bit. Additionally, the method can comprise connecting a second terminal of the first two-terminal memory and a second terminal of the second two-terminal memory to a low voltage, or ground, and applying a program voltage on the program source concurrently to the first terminal of the first two-terminal memory and the first terminal of the second two-terminal memory. Additionally, the method can comprise detecting a programming event for one of: the first two-terminal memory and the second two-terminal memory and in response to detecting the programming event, disconnecting the program voltage from a second of: the first two-terminal memory and the second two-terminal memory, prior to a duration of the program cycle coming to an end.

According to further embodiments, disclosed is a method for programming a physical unclonable feature (PUF) bit defined by a plurality of two-terminal resistive switching memory cells comprising a first memory cell and a second memory cell. The method can comprise connecting a first electrode of the first memory cell through a transistor to a voltage source and connecting a first electrode of the second memory cell through a second transistor to the voltage source. The method can additionally comprise connecting second electrodes of the first memory cell and of the second memory cell indirectly to a low voltage and applying a program voltage at the voltage source concurrently to the first memory cell and to the second memory cell. The method can also comprise activating a detection circuit to detect a program event for the first memory cell or the second memory cell. In addition to the foregoing, the method can comprise at least one of: deactivating the second transistor in response to detecting the program event for the first memory cell or deactivating the first transistor in response to detecting the program event for the second memory cell.

The following description and the drawings set forth certain illustrative aspects of the specification. These aspects are indicative, however, of but a few of the various ways in which the principles of the specification may be employed. Other advantages and novel features of the specification will become apparent from the following detailed description of the specification when considered in conjunction with the drawings.

BRIEF DESCRIPTION OF THE DRAWINGS

Various aspects or features of this disclosure are described with reference to the drawings, wherein like reference numerals are used to refer to like elements throughout. In this specification, numerous specific details are set forth in order to provide a thorough understanding of this disclosure. It should be understood, however, that certain aspects of the subject disclosure may be practiced without these specific details, or with other methods, components, materials, etc. In other instances, well-known structures and devices are shown in block diagram form to facilitate describing the subject disclosure.

FIG. 6 illustrates an example differential program circuit having intrinsic program suppression coupled with adjacent path disablement, in an embodiment(s).

FIGS. 10 and 10A depict a flowchart of an example method for differential programming according to still further embodiments of the present disclosure.

DETAILED DESCRIPTION

Introduction

Figure 1:
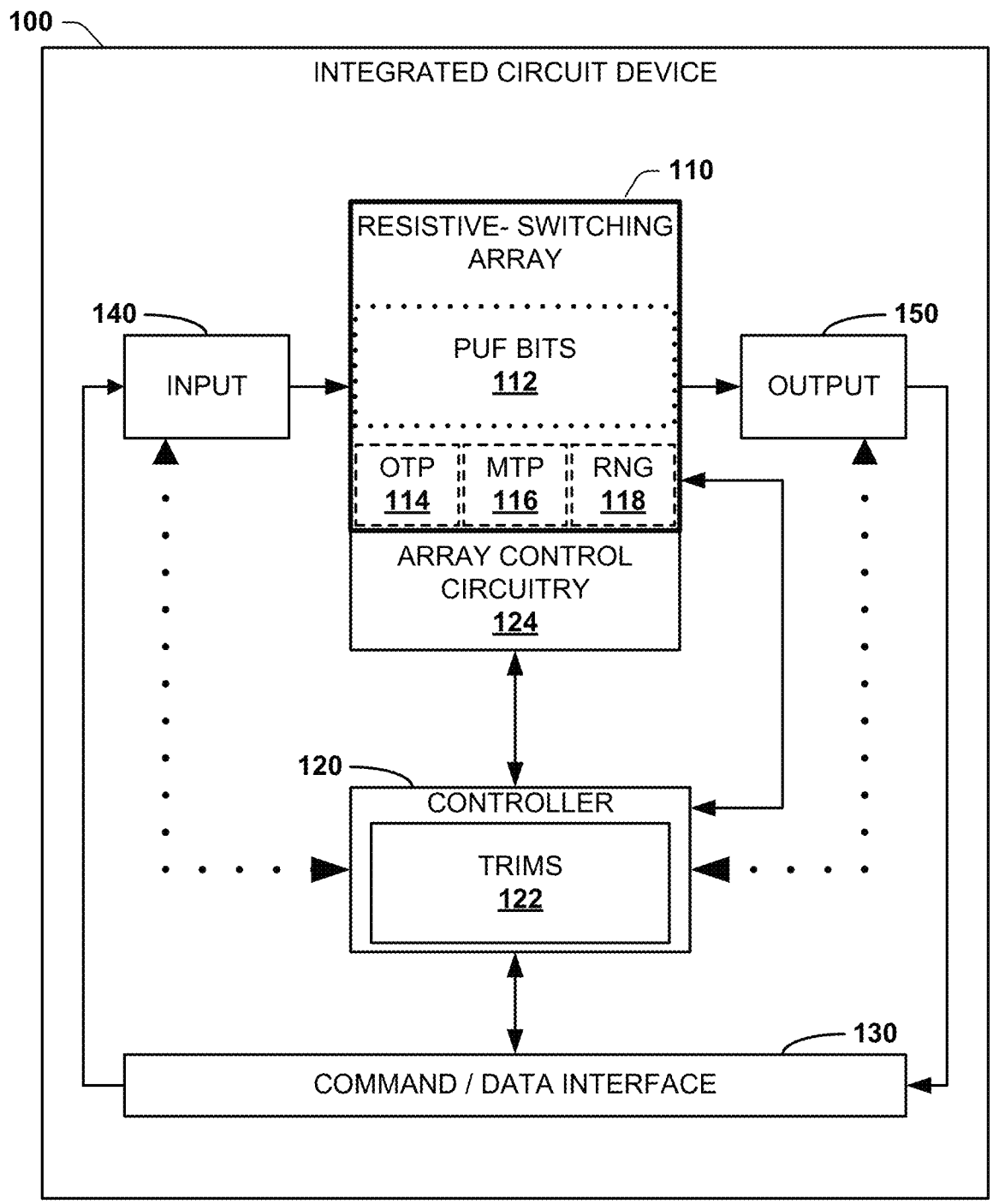
FIG. 1 depicts a block diagram of a sample electronic device and an array of two-terminal resistive memory for differential programming, in an embodiment.

One or more embodiments of the present disclosure leverage stochastic or substantially stochastic physical characteristics of nano-scale resistive switching devices to generate data. Being generally random, stochastic features of resistive switching devices can be leveraged to produce data that has little to no correlation among a population of such devices. As a result, that data can be suited to applications requiring distinct or unique identification, such as identification and authorization applications pertaining to a device (e.g., a semiconductor die—also referred to herein as a semiconductor chip—or a semiconductor wafer, group(s) of dies, group(s) of wafers, an electronic device incorporating a semiconductor die(s), and so forth). Further, highly non-correlated data can also be utilized for security applications, such as random number generation, cryptography key generation applications, and the like.

In addition, various embodiments disclose resistive switching device processes utilized to generate high-entropic data sequences that meet or exceed scientific standards for randomness, and are comparable with high-quality cryptographic random number sources. Moreover, the switching device processes utilized to generate data sequences can be selected from native resistive switching devices (e.g., devices that have not previously been programmed, and are original or virgin devices post-fabrication) that most closely leverage nano-scale unclonable physical characteristics of the resistive switching devices. This achieves high non-correlation among devices on a die (intra-die), among dies on a wafer (inter-die) and among wafers in a fabrication facility, minimizing likelihood that a data sequence generated from resistive switching devices on a single die is repeated by other devices on that same die, or repeated by other resistive switching devices on a given wafer, or on different wafers, and so forth.

Stochastic physical characteristics can also be referred to as physical unclonable functions (PUF), physically unclonable features (also PUF), physical(ly) unclonable features, or other suitable nomenclature. Data derived from such stochastic physical characteristics are referred to herein as PUF data (or a PUF bit, or group of PUF bits, etc.) and generally involve a resistive switching cell process applied to one or more resistive switching cells that define a PUF bit(s) (e.g., see U.S. patent application Ser. No. 17/223,817 filed Apr. 6, 2021, incorporated by reference hereinabove). PUF data can be generated from a cell process(es) applied to native resistive switching memory cells (sometimes referred to as virgin resistive switching memory cells) that have not had a memory process previously applied to those memory cells, following manufacture. Example memory processes can include a forming process (e.g., comprising one or more electrical forming pulses), a program process (e.g., comprising one or more electrical program pulses), an erase process (e.g., comprising one or more electrical erase pulses), an overwrite process, and so forth. In addition, PUF data generated from non-volatile resistive switching memory cells can thereafter be stored and read from at least a subset of the non-volatile resistive switching memory cells utilized to generate the PUF data.

In one or more additional embodiments, some disclosed sequence generation processes can be rendered permanent through one-time programmable processes, allowing a sequence to be reliably re-read over a very large number of read cycles to reliably and accurately reproduce a previously generated data sequence, achieving extremely low bit error rates. In still further embodiments, disclosed processes for generating non-correlated data sequences can involve processes compatible with resistive switching device operation, allowing a set of resistive switching devices to be selected post-fabrication from any suitable subset of resistive switching devices on a chip. Systems and methods are further provided to export control of resistive switching device selection, data sequence process selection and process configuration-associated with physically unclonable data sequence generation disclosed herein—to a user of the chip post-fabrication. Various other embodiments will be readily apparent based on the disclosure herein and the associated drawings.

As utilized herein, the term "substantially" and other relative terms or terms of degree (e.g., about, approximately, substantially, and so forth) are intended to have the meaning specified explicitly in conjunction with their use herein, or a meaning which can be reasonably inferred by one of ordinary skill in the art, or a reasonable variation of a specified quality (ies) or quantity (ies) that would be understood by one of ordinary skill in the art by reference to this entire specification (including the knowledge of one of ordinary skill in the art as well as material incorporated by reference herein). As an example, a term of degree could refer to reasonable manufacturing tolerances about which a specified quality or quantity could be realized with fabrication equipment. Thus, as a specific illustration, though non-limiting, for an element of a resistive switching device expressly identified as having a dimension of about 50 angstroms (Å), the relative term "about" can mean reasonable variances about 50 A that one of ordinary skill in the art would anticipate the specified dimension of the element could be realized with commercial fabrication equipment, industrial fabrication equipment, laboratory fabrication equipment, or the like, and is not limited to a mathematically precise quantity (or quality). In other examples, a term of degree could mean a variance of +/−0-3%, +/−0-5%, or +/−0-10% of an expressly stated value, where suitable to one of ordinary skill in the art to achieve a stated function or feature of an element disclosed herein. In still other examples, a term of degree could mean any suitable variance in quality (ies) or quantity (ies) that would be suitable to accomplish an explicitly disclosed function(s) or feature(s) of a disclosed element. Accordingly, the subject specification is by no means limited only to specific qualities and quantities disclosed herein, but includes all variations of a specified quality (ies) or quantity (ies) reasonably conveyed to one of ordinary skill in the art by way of the context disclosed herein.

Integrated circuit techniques for fabricating resistive switching memory can cause physical properties having the stochastic or substantially stochastic characteristics desired for generating PUF data. For instance, these physical properties can have little or no replication or repetition among fabricated memory cells made by the same process. As one example, one or more layers of a disclosed resistive switching device can have a root mean square (RMS) surface roughness of >0.2 nm, up to a maximum of about 10.0 nm surface roughness, in an embodiment. This results in random or near-random variation in layer thickness, including unpredictable changes in physical characteristics of such devices. In some theoretical models the RMS surface roughness can affect the geometry of a resistive switching material layer inducing stochastic or substantially stochastic variations in resistive switching devices properties such as: native or virgin (e.g., as fabricated) current conductance, program voltage, differential program voltage, program speed, differential program speed, among others disclosed throughout this specification. As further examples, different resistive-switching memory cells and cell technologies can have different discrete programmable resistances, different associated program/erase voltages, as well as other differentiating characteristics. In an embodiment, a resistive switching memory device resulting from a 28 nm photolithographic process with device size between about 50 nanometer (nm) width and about 130 nm width (e.g., about 100 nm width, about 56 nm width, about 75 nm width, about 128 nm width, and so forth) can be suitable to achieve stochastic physical characteristics disclosed herein. In other embodiments, a 22 nm photolithographic process producing a device size between 40 nm and 100 nm width (e.g., about 44 nm width, about 60 nm width, about 66 nm width, about 88 nm width, and so forth) can achieve stochastic physical characteristics.

In addition to the foregoing, stochastic physical features of resistive switching devices can vary among devices in a die and among devices on a wafer or multiple wafers. As a result, minimal correlation in the native physical features among devices, dies, wafers and so forth, can yield minimal correlation between operational processes and data derived from such processes among devices, dies, wafers and the like. For instance, a native electrical resistance of a resistive switching layer (RSL) can depend at least in part on these non-correlated physical features and can vary from device to device even for adjacent devices in a single array on a single die (and, as previously stated, among multiple dies, wafers, and so on). Further, a current flow through the RSL in a native un-programmed state, a program voltage in the native un-programmed state, a program speed in the native un-programmed state, differential program voltage/current/speed in the native un-programmed state, and so on, can vary among resistive switching devices. Processes disclosed herein for forming resistive switching devices and for leveraging stochastic or substantially stochastic physically unclonable features of resistive switching devices can provide excellent non-correlated data sequences.

As utilized herein, the term "native", "original", "virgin" or the like refers to post-fabrication but pre-commercial operation of resistive switching devices on a semiconductor die. Native (and like terminology) need not exclude some or all post-fabrication operations such as quality testing or other verification routines performed by a manufacturer, and even some pre-commercial operation by a non-manufacturer such as testing to ensure manufacturer quality specifications are met by a chip, chip setup routines or configuration routines (e.g., defining one-time programmable memory or identifier memory within an array of resistive switching memory; see e.g., FIG. 1, infra), among others. In general, a resistive switching device is in a native state, as utilized herein, if it has not yet received a stimulus (e.g., electrical, thermal, magnetic, or a like stimulus known in the art, suitable combinations thereof, and so forth) suitable to form a conductive filament within the resistive switching device and change the resistive switching device from an electrically resistive state to an electrically conductive state as described herein or known in the art.

As the name implies, a two-terminal resistive switching device has two terminals or electrodes. Herein, the terms "electrode" and "terminal" are used interchangeably; moreover, a two-terminal resistive switching device includes a non-volatile two-terminal memory device as well as a volatile two-terminal switching device. Generally, a first electrode of a two-terminal resistive switching device is referred to as a "top electrode" (TE) and a second electrode of the two-terminal resistive switching device is referred to as a "bottom electrode" (BE), although it is understood that electrodes of two-terminal resistive switching devices can be according to any suitable arrangement, including a horizontal arrangement in which components of a memory cell are (substantially) side-by-side rather than overlying one another. Between the TE and BE of a two-terminal resistive switching device is typically an interface layer sometimes referred to as a switching layer, a resistive switching medium (RSM) or a resistive switching layer (RSL); such devices are not limited to these layers, however, as one or more barrier layer(s), adhesion layer(s), ion conduction layer(s), seed layer(s), particle source layer(s) or the like—as disclosed herein, disclosed within a publication incorporated by reference herein, as generally understood and utilized in the art or reasonably conveyed to one of ordinary skill in the art by way of the context provided herein and its addition to the general understanding in the art or the incorporated publications—may be included between or adjacent one or more of the TE, the BE or the interface layer consistent with suitable operation of such device.

Composition of memory cells, generally speaking, can vary per device with different components, materials or deposition processes selected to achieve desired characteristics (e.g., stoichiometry/non-stoichiometry, volatility/non-volatility, on/off current ratio, switching time, read time, memory durability, program/erase cycle, and so on). One example of a filamentary-based device can comprise: a conductive layer, e.g., metal, metal-alloy, metal-nitride, (e.g., comprising TiN, TaN, TiW, or other suitable metal compounds), an optional interface layer (e.g., doped p-type (or n-type) silicon (Si) bearing layer (e.g., a p-type or n-type Si bearing layer, p-type or n-type polysilicon, p-type or n-type polycrystalline SiGe, etc.)), a resistive switching layer (RSL) and an active metal-containing layer capable of being ionized. Under suitable conditions, the active metal-containing layer can provide filament-forming ions to the RSL. In such embodiments, a conductive filament (e.g., formed by the ions) can facilitate electrical conductivity through at least a subset of the RSL, and a resistance of the filament-based device can be determined, as one example, by a tunneling resistance between the filament and the conductive layer. A memory cell having such characteristics may be described as a filamentary-based device.

A RSL (which can also be referred to in the art as a resistive switching media (RSM)) can comprise, e.g., an undoped amorphous Si-containing layer, a semiconductor layer having intrinsic characteristics, a stoichiometric or non-stoichiometric silicon nitride (e.g., SiN, $Si_3N_4$, $SiN_x$, etc.), a Si sub-oxide (e.g., SiOx wherein x has a value between 0.1 and 2), a Si sub-nitride, a metal oxide, a metal nitride, a non-stoichiometric silicon compound, and so forth. Other examples of materials suitable for the RSL could include $Si_xGe_yO_2$ (where x, y and z are respective suitable positive numbers), a silicon oxide (e.g., SiON, where N is a suitable positive number), a silicon oxynitride, an undoped amorphous Si (a-Si), amorphous SiGe (a-SiGe), $TaO_B$ (where B is a suitable positive number), HfOc (where C is a suitable positive number), TiOD (where D is a suitable number), $Al_2OF$ (where E is a suitable positive number) and so forth, a nitride (e.g., AlN, SiN), or a suitable combination thereof.

In some embodiments, a RSL employed as part of a non-volatile memory device (non-volatile RSL) can include a relatively large number (e.g., compared to a volatile selector device) of material voids or defects to trap neutral metal particles (e.g., at low voltage) within the RSL. The large number of voids or defects can facilitate formation of a thick, stable structure of the neutral metal particles. In such a structure, these trapped particles can maintain the non-volatile memory device in a low resistance state in the absence of an external stimulus (e.g., electrical power), thereby achieving non-volatile operation. In other embodiments, a RSL employed for a volatile selector device (volatile RSL) can have very few material voids or defects for trapping particles. Because of the few particle-trapping voids/defects, a conductive filament formed in such an RSL can be quite thin (e.g., one to a few particles wide depending on field strength, particle material or RSL material, or a suitable combination of the foregoing), and unstable absent a suitably high external stimulus (e.g., an electric field, voltage, current, joule heating, or a suitable combination thereof). Moreover, the particles can be selected to have high surface energy, and good diffusivity within the RSL. This leads to a conductive filament that can form rapidly in response to a suitable stimulus, but also deform quite readily, e.g., in response to the external stimulus dropping below a deformation magnitude (which can be lower than a formation magnitude of the external stimulus associated with forming the volatile conductive filament, e.g., in response to a current flowing through the selector device; see U.S. Pat. No. 9,633,724 B2 hereby incorporated by reference herein in its entirety and for all purposes). Note that a volatile RSL and conductive filament for the selector device can have different electrical characteristics than a conductive filament and non-volatile RSL for the non-volatile memory device. For instance, the selector device RSL can have higher material electrical resistance, and can have higher on/off current ratio, among others.

An active metal-containing layer for a filamentary-based memory cell can include, among others: silver (Ag), gold (Au), titanium (Ti), titanium-nitride (TiN) or other suitable compounds of titanium, nickel (Ni), copper (Cu), aluminum (Al), chromium (Cr), tantalum (Ta), iron (Fe), manganese (Mn), tungsten (W), vanadium (V), cobalt (Co), platinum (Pt), hafnium (Hf), and palladium (Pd). Other suitable conductive materials, as well as stoichiometric or non-stoichiometric: compounds, nitrides, oxides, alloys, mixtures or combinations of the foregoing or similar materials can be employed for the active metal-containing layer in some aspects of the subject disclosure. Further, a non-stoichiometric compound, such as a non-stoichiometric metal oxide/metal-oxygen or metal nitride/metal nitrogen (e.g., $AlO_x$, $AlN_x$, $CuO_x$, $CuN_x$, $AgO_x$, $AgN_x$, and so forth, where x is a suitable positive number or range of numbers, such as: 0<x<2, 0<x<3, 0<x<4 or other number/range of numbers depending on metal compound, which can have differing values for differing ones of the non-stoichiometric compounds) or other suitable metal compound can be employed for the active metal-containing layer, in at least one embodiment.

In one or more embodiments, a disclosed filamentary resistive switching device can include an active metal layer comprising a metal-nitrogen selected from the group consisting of: $TiN_x$, $TaN_x$, $AlN_x$, $CuN_x$, $WN_x$ and $AgN_x$, where x is a positive number (or range of numbers) that can vary per metal-nitrogen material. In a further embodiment(s), the active metal layer can comprise a metal-oxygen selected from the group consisting of: $TiO_x$, $TaO_x$, $AlO_x$, $CuO_x$, $WO_x$ and $AgO_x$ where x is a positive number (or range of numbers) that can likewise vary per metal-oxygen material. In yet another embodiment(s), the active metal layer can comprise a metal oxygen-nitrogen selected from the group consisting of: $TiO_aN_b$, $AlO_aN_b$, $CuO_aN_b$, $WO_aN_b$ and $AgO_aN_p$, where a and b are suitable positive numbers/ranges of numbers. The disclosed filamentary resistive switching device can further comprise a switching layer comprising a switching material selected from the group consisting of: $SiO_y$, $AlN_y$, $TiO_y$, $TaO_y$, $AlO_y$, $CuO_y$, $TiN_y$, $TiN_y$, $TaN_x$, $TaN_y$, $SiOx$, $SiN_y$, $AlN_x$, $CuN_x$, $CuN_y$, $AgN_x$, $AgN_y$, $TiO_x$, $TaO_x$, $AlO_x$, $CuO_x$, $AgO_x$, and $AgO_y$, where x and y are positive numbers (or ranges), and y is larger than x. Various combinations of the above are envisioned and contemplated within the scope of embodiments of the present invention.

In one example, a disclosed filamentary resistive switching device comprises a particle donor layer (e.g., the active metal-containing layer) comprising a stoichiometric or non-stoichiometric metal compound (or mixture) and a resistive switching layer. In one alternative embodiment of this example, the particle donor layer comprises a metal-nitrogen: $MN_x$, e.g., $AgN_x$, $TiN_x$, $AlN_x$, etc., and the resistive switching layer comprises a metal-nitrogen: $MN_y$, e.g., $AgO_y$, $TiO_y$, $AlO_y$, and so forth, where y and x are positive numbers (or ranges), and in some cases y is larger than x. In an alternative embodiment of this example, the particle donor layer comprises a metal-oxygen: $MO_x$, e.g., $AgO_x$, $TiO_x$, $AlO_x$, and so on, and the resistive switching layer comprises a metal-oxygen: $MO_y$, e.g., $AgO_y$, $TiO_y$, $AlO_y$, or the like, where y and x are positive numbers (or ranges), and in some cases y is larger than x. In yet another alternative, the metal compound of the particle donor layer is a $MN_x$ (e.g., $AgN_x$, $TiN_x$, $AlN_x$, etc.), and the resistive switching layer is selected from a group consisting of $MO_y$ (e.g., $AgO_y$, $TiO_y$, $AlO_y$, etc.) and $SiO_y$, where x and y are typically non-stoichiometric values, or vice versa in a still further embodiment.

As utilized herein, variables x, y, a, b, and so forth representative of values or ratios of one element with respect to another (or others) in a compound or mixture can have different values (or ranges) suitable for respective compounds/mixtures, and are not intended to denote a same or similar value or ratio among the compounds. Mixtures can refer to non-stoichiometric materials with free elements therein-such as metal-rich nitride or oxide (metal-oxide/nitride with free metal atoms), metal-poor nitride or oxide (metal-oxide/nitride with free oxygen/nitrogen atoms)—as well as other combinations of elements that do not form traditional stoichiometric compounds as understood in the art. Some details pertaining to embodiments of the subject disclosure can be found in the following U.S. patent applications that are licensed to the assignee of the present application for patent: application Ser. No. 11/875,541 filed Oct. 19, 2007 and application Ser. No. 12/575,921 filed Oct. 8, 2009; each of the foregoing patent applications are hereby incorporated by reference herein in their respective entireties and for all purposes in addition to those incorporated by reference elsewhere herein.

Some embodiments of the subject disclosure can employ a bipolar switching device that exhibits a first switching response (e.g., programming to one of a set of program states) to an electrical signal of a first polarity and a second switching response (e.g., erasing to an erase state) to the electrical signal having a second polarity. The bipolar switching device is contrasted, for instance, with a unipolar device that exhibits both the first switching response (e.g., programming) and the second switching response (e.g., erasing) in response to electrical signals having the same polarity and different magnitudes.

In some disclosed embodiments, completion of a conductive filament can involve only a few particles (e.g., atoms, ions, conductive compounds, etc.) of conductive material, or less. As one particular example, an electrically continuous conductive filament could be established by position of 1-3 atoms at a boundary of a switching layer, whereas repositioning of one or more of these atoms can break that electrical continuity, in some embodiments. Because the scale is so small between a completed filament and non-completed filament, illicit side-channel attempts to read bits of memory—for example through high intensity microscopy—can be very difficult, if not impossible due to the difficulty of imaging such small particles and determining whether their location is sufficient to establish electrical continuity. Still further, disclosed resistive switching devices can be formed among metal lines of a semiconductor chip (e.g., among backend-of-line wiring layers). The density of metal wiring layers further occludes visibility of the resistive switching devices, making common side-channel techniques unprofitable.

Following program or erase pulses, a read pulse can be asserted. This read pulse is typically lower in magnitude relative to program or erase pulses and typically insufficient to affect the conductive filament and/or change the state of the two-terminal memory cell. By applying a read pulse to one of the electrodes of the two-terminal memory, a measured current (e.g., $I_{on}$) when compared to a predetermined threshold current can be indicative of the conductive state of the two-terminal memory cell. The threshold current can be preset based on expected current values in different states (e.g., high resistance state current; respective currents of one or more low resistance states, and so forth) of the two-terminal memory device, suitable for a given two-terminal memory technology. For example, when the conductive filament has been formed (e.g., in response to application of a program pulse), the conductance of the cell is greater than otherwise and the measured current (e.g., $I_{on}$) reading in response to the read pulse will be greater. On the other hand, when the conductive filament is removed (e.g., in response to application of an erase pulse), the resistance of the cell is high because the interface layer has a relatively high electrical resistance, so the conductance of the cell is lower and the measured current (e.g., $I_{off}$) reading in response to the read pulse will be lower. By convention, when the conductive filament is formed, the memory cell is said to be in the "on-state" with a high conductance. When the conductive filament is not extant, the memory cell is said to be in the "off-state". A memory cell being in the on-state or the off-state can be logically mapped to binary values such as, e.g., "1" and "0". It is understood that conventions used herein associated with the state of the cell or the associated logical binary mapping are not intended to be limiting, as other conventions, including an opposite convention can be employed in connection with the disclosed subject matter. Techniques detailed herein are described and illustrated in connection with single-level cell (SLC) memory, but it is understood that the disclosed techniques can also be utilized for multi-level cell (MLC) memory in which a single memory cell can retain a set of measurably distinct states that represent multiple bits of information.

Overview

FIG. 1 illustrates a block diagram of an example integrated circuit device 100 for an electronic device according to one or more embodiments of the present disclosure. Integrated circuit device 100 includes an array(s) 110 of two-terminal resistive-switching memory cells. Array(s) 110 of memory can include resistive switching memory cells, and different portions of the resistive switching memory cells can be characterized (and re-characterized, where suitable) for different memory cell functions. Example memory cell functions can include physical identifier functions (e.g., physical unclonable feature (PUF), random number generation (RNG)), one-time programmable (OTP) functions and many-time programmable (MTP) functions (also referred to as rewritable or program/erase functions). Different groups of memory cells of array(s) 110 are provided (or can be characterized) to implement these functions. As described herein, identifier functions can be implemented by way of multiple resistive-switching memory cells collectively defined as an identifier bit (or by single cells defining a bit in some embodiments). Thus, depicted in FIG. 1 are PUF memory bits 112, RNG memory bits 118, OTP memory cells 114 as well as MTP or reversibly programmable memory cells 116. Array(s) 110 of resistive-switching memory cells can be characterized for other types of memory cell functions not specifically depicted in FIG. 1, where suitable.

Although array(s) 100 of resistive-switching memory cells illustrates designated sections of characterized memory cells, no spatial orientation, relative or absolute, is implied by the position of the dotted blocks within array(s) 110 of memory identifying PUF, OTP, MTP, or RNG data. Further, array(s) 110 of resistive-switching memory cells can be uncharacterized (e.g., upon initial fabrication), re-characterized (e.g., in response to re-characterization of cells from RNG to MTP, from MTP to OTP, and so forth), or de-characterized (e.g., removing previous characterizations, where suitable), or the like, as suitable. Accordingly, the characterization of memory cells in array(s) 110 is illustrative only, and array(s) 100 can be wholly uncharacterized, have some of the disclosed characterizations, and so forth.

In at least one alternative or additional embodiment(s), some memory cells of array(s) 110 of two-terminal resistive-switching memory cells can have a fixed size or number of memory cells located within a group of addresses of array(s) 110 of memory pre-assigned to one operational characteristic (e.g., MTP operation, OTP operation, RNG operation, PUF operation, or the like). Some or all of these pre-assigned memory cells could be re-characterized by controller 120 in some aspects of the disclosure, although some pre-assigned memory cell characterizations can be permanent and not re-characterizable in at least one aspect, and depending on design choice. In such embodiments, a host command received by a controller 120 identifying addresses of target memory cells can imply an operation consistent with the pre-assigned operational characteristic associated with those addresses. As an example, a write command targeting memory cell addresses pre-assigned to PUF operational characterization can imply a PUF write command, and so forth. When implementing the write command on memory cells pre-assigned to PUF operation, controller 120 can implement instructions suitable for a PUF write, rather than an MTP write, OTP write, or even a RNG write, as an example. In other embodiments, even where some memory cells of array(s) 110 are pre-assigned a characterization, other memory cells can be un-characterized, and can instead be assigned an operational characterization selected by an end user (or an external host device), where suitable, or can even be dynamically characterized or re-characterized as described herein.

In a general sense, identifier memory functions as utilized herein can refer to memory utilized to generate, store or operate in a fashion to generate uncorrelated data, generally understood to be suitable for distinguishing one set of identifier data from another set of identifier data. As noted supra, specific examples of identifier memory can include resistive switching cells characterized to operate as PUF memory, RNG memory, or the like. Other resistive-switching memory cells of array(s) 110 can be characterized as OTP memory or MTP memory, as illustrated.

In some disclosed embodiments, one or more of: PUF bits 112, OTP bits 114, MTP bits 116 and RNG bits 118 can be separate memory structures from array(s) 110 of memory (e.g., located externally to array(s) 110 on a semiconductor chip) or can be at least in part included within array(s) 110 of memory (e.g., an array among a set of arrays that embody array(s) 110 of memory, a block of memory within such an array(s) 110, a set of pages within one or more blocks or arrays, or other suitable arrangement).

Figure 11:
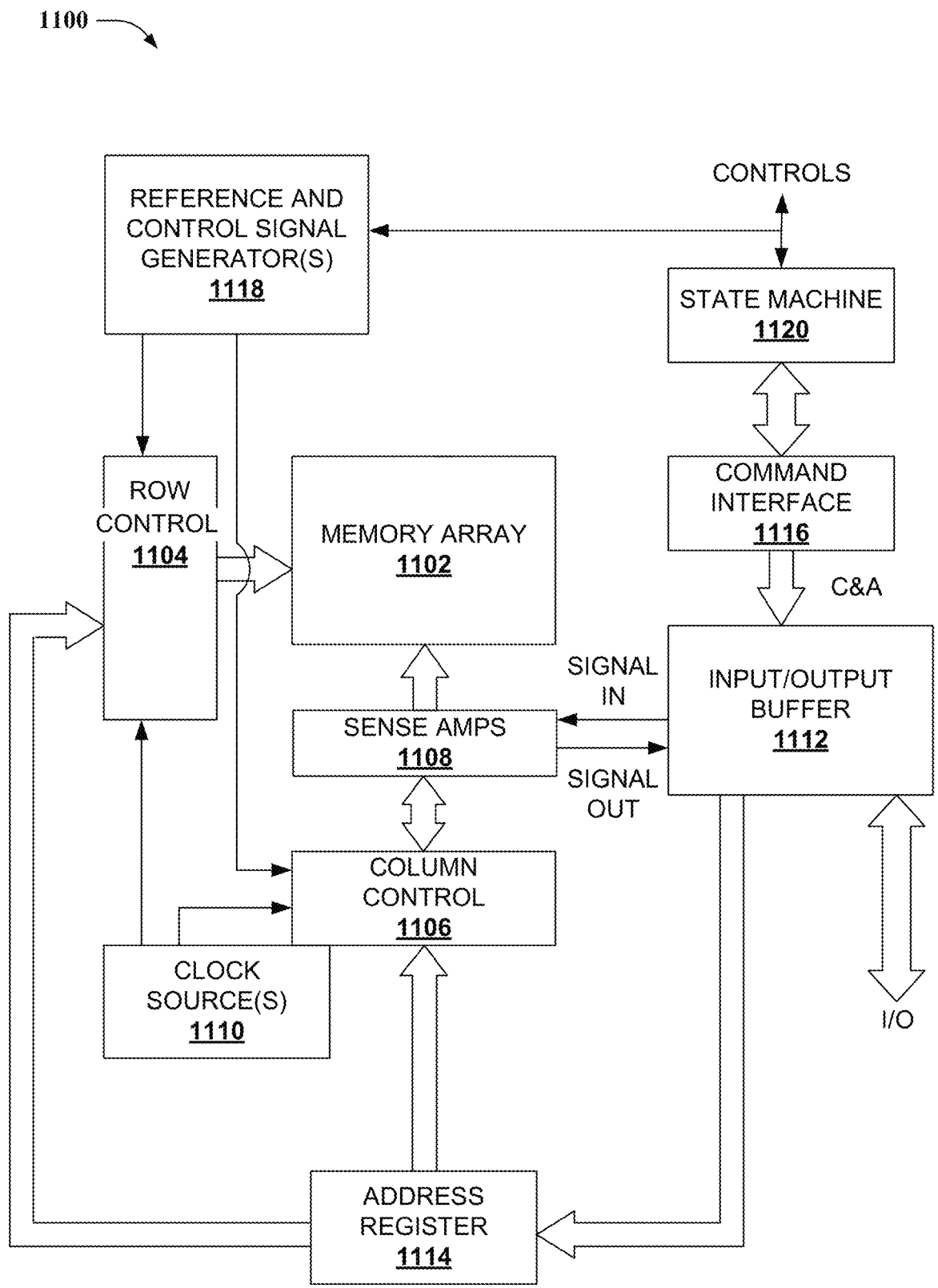
FIG. 11 depicts a block diagram of a sample electronic operating environment in accordance with certain embodiments presented herein.

Controller 120 is provided to implement memory operations upon array(s) 110 of resistive-switching memory cells (e.g., see also FIG. 11, infra). Memory operations can include processes such as program (write), read, overwrite, erase, and so forth, operations suitable for operation of MTP bits 116. Memory operations can also include processes for program (write) or reading OTP bits 114. Instructions for implementing memory operations according to the various characterizations can be stored in trim instructions 122. Additionally, controller 120 can be configured to characterize different memory cells of array(s) 110 according to a disclosed function: an OTP characterization, an MTP characterization, a RNG characterization, a PUF characterization, or the like, or a suitable combination of the foregoing. Characterization of memory cells can be implemented in response to explicit memory characterization protocols (by way of command/data interface 130, for example), which can be implemented by a manufacturer post-fabrication of integrated circuit device 100, by a distributor or reseller of integrated circuit device 100 after fabrication, by an end-user as part of a chip calibration routine, or as a dynamic process during operation of integrated circuit device 100, or even in response to a host-generated memory command or memory cell characterization command, according to various embodiments. As an illustrative example, a host device communicatively coupled to integrated circuit device 100 can issue a host command to generate PUF data; such a host command can include or imply a PUF characterization protocol on memory bits identified in the host command, or a command to characterize cells as PUF bits 112 can be received separate from a command to generate PUF data from those cells. In various embodiments, trim instructions 122 can store protocols to characterize memory cells according to PUF, RNG, MTP, OTP characterizations, as well as implement memory operations consistent with those characterizations.

Also illustrated in integrated circuit device 100 is an input(s) 140 and output(s) 150. In some embodiments, input(s) 140 can include (or provide a pathway for) data to be stored within array(s) 110 of two-terminal resistive-switching memory cells, such as MTP bits 116 or OTP bits 114. Output(s) 150 can output data stored within resistive switching devices of array(s) 110, including PUF bits 112 and RNG bits 118 as well as OTP bits 114 and MTP bits 116. In some embodiments, output(s) 150 can output data that results from computations utilizing data stored in PUF bits 112 (or RNG bits 118) or stored within MTP bits 116 or OTP bits 114 resulting from such computations, in further embodiments.

A command/data interface 130 is provided to receive memory commands from an external device and respond to those commands. Further, data to be written to array(s) 110 can be received by way of command/data interface 130, and data output from array(s) 110 can be provided over command/data interface 130. In at least some embodiments, controller 120 can dynamically expose selection and (re-)characterization of memory cells of array(s) 110 to an external host device (separate from integrated circuit device 100—not depicted) by way of command/data interface 130. In various example implementations, the external host device can be manufactured separately and communicatively interconnected by one or more network or device interfaces to command/data interface 130 to accomplish this embodiment(s).

In addition to the foregoing, disclosed resistive switching devices have excellent properties for generating identifier data sequences. Such properties include high entropy, which is suitable for generating random or substantially random numbers, low bit error rate (BER), inherent difficulty in reverse engineering or illicit side-channel data access, and fast sensing times. For example, a bit sequence of 128 or 256 identifier (e.g., PUF) bits can be formed from 128 or 256 resistive switching devices or 128/256 groups (e.g., pairs, etc.) of multiple such resistive switching devices (as described in differential identifier bit generation; see FIGS. 2, 3 and 5, infra). High randomness in generating identifier bits minimizes non-random patterns between bits (resistive switching devices/groups of such devices) of a sequence, mitigating or avoiding false rejection rates.

More specifically, bit error rates (BER) s of identifier data generated with disclosed resistive switching devices are extremely low compared to techniques for generating PUF with static random access memory (SRAM). This allows integrated circuit device 100 to generate highly non-correlated identifier bits without special BER-reducing circuitry permanently affixed to memory cells from which identifier data is generated. As a result, any native two-terminal resistive switching memory cell(s) can be utilized to generate PUF bits 112, and any suitable (low cycle count) two-terminal resistive switching memory cell(s) can be utilized to generate RNG bits 118. As a result, embodiments disclosed herein can utilize row and column selection circuitry (including multiplexers—not depicted—but see row control 1104 and column control 1106 of FIG. 11, infra) and processes associated with implementing read, write, erase and other memory operations on resistive switching devices (e.g., FIGS. 11 and 12, infra), and extend those circuitry and processes to generating or storing PUF data, RNG data, OTP data, MTP data, and so forth. In such embodiments, resistive switching devices utilized for MTP memory operations, identifier data or OTP storage need not be fixed on manufacture, and can be characterized or dynamically re-characterized by controller 120 in disclosed embodiments. Some technologies for generating PUF data cannot achieve these characteristics described for integrated circuit device 100, resulting in a technical advantage for integrated circuit device 100.

In one or more embodiments, controller 120 can be operable to perform memory operations on array(s) 110 of memory. For instance, controller 120 can be operable to perform sensing operations pertaining to generating an identifier data bit from one (or a group of) resistive switching device(s) operably characterized as PUF bits 112 (or RNG bits 118), in an embodiment(s). Examples of non-differential sensing operations pertaining to generating an identifier bit from a single memory cell can include: native current of a never-programmed resistive switching device in the context of PUF data (or leak current of an un-programmed device in the context of RNG data) in response to a sub-program voltage, native electrical resistance of a resistive switching device, detection of program events, detection of speed or timing of program events, a program voltage, a program current, an on-state (programmed) resistance, an erase voltage or current, a delay frequency, a parasitic resistance or capacitance, a program or erase minimum pulse width, and so forth, or suitable combinations of the foregoing, as described herein (or as described within U.S. application Ser. No. 17/223,817 incorporated by reference hereinabove). In general, however, these sensing operations can be digitized to generate PUF or RNG data by comparing a measured result of a sensing operation (native current in response to sub-program voltage, detection of program event in response to a program signal, speed or timing of program event, a voltage at which a device becomes programmed, and so forth) to a threshold value stored in trim instructions 122 of controller 120. Generation of PUF data usually involves never-programmed resistive switching memory cells, whereas generation of RNG data can involve never-programmed cells, or un-programmed cells with relatively low program counts (e.g., fewer than 10 program events; fewer than 50 program events; fewer than 100 program events; fewer than 1000 program events; or other suitable value, or any suitable value or range there between), although the subject disclosure is not strictly limited to these definitions.

As further examples, controller 120 can be operable to perform a program operation(s) pertaining to generating an identifier data bit utilizing an identifier memory cell(s) 112, 118 of array(s) 110 of memory. Examples of such program operations include applying a program voltage magnitude to a never-programmed (or un-programmed for RNG data) memory cell and determining whether the cell is programmed or not programmed in response to the selected program voltage magnitude (program voltage magnitude differentiation). The identifier data bit can be digitized by assigning a '1' if the cell is programmed, and '0' if not programmed (or vice versa). This program operation leverages characteristics of a population of ReRAM cells that do not form a filament, or program or erase at the same voltage for a given program time. Further examples include applying a program signal of selected pulse duration to a never-programmed (or un-programmed) memory cell and determining whether the cell is programmed or not programmed after the selected pulse duration (program time differentiation). This program operation leverages characteristics of the population of ReRAM cells that do not form a filament or program or erase in the same cycle time (e.g., for a given voltage, or other constraints), since the time needed for such operations on two randomly selected ReRAM cells from a large population varies. As a specific example: one cell may program at 1 us while an adjacent cell programs at 1.3 us in response to the same voltage. Similar to the previous example, the identifier data bit can be digitized by assigning a '1' if the cell is programmed, and '0' if not programmed (or vice versa) after a cycle time of, for instance, 1.2 us. Another example includes applying a sub-program voltage to a never-programmed (or un-programmed) memory cell and determining whether a native (or leak) non-programmed current is above or below a preselected current threshold (native/leak current differentiation). The identifier bit can be digitized by assigning a '1' if native current is above the threshold and assigning a '0' if native current is below the threshold (or vice versa). Other examples or combinations of the foregoing known in the art or reasonably suggested to one of ordinary skill in the art by way of the context provided herein are considered within the scope of the present disclosure.

In still other embodiments, controller 120 can be configured to implement differential operations pertaining to generating an identifier bit from a plurality of resistive switching devices. Generally, differential operations compare response of one or more cells of a plurality of memory cells to a memory operation and digitize an identifier bit associated with the plurality of memory cells based on relative responses of the one or more memory cells. Differential operations usable to generate an identifier bit according to aspects of the present disclosure can include: differential program speed of a group of never (or un) programmed memory cells, differential native program voltage of the group of memory cells, differential native (leak) current of the group of memory cells, differential native electrical resistance of the group of memory cells, differential on-state resistance of the group of memory cells, differential erase voltage or current of the group of memory cells, differential delay frequency of the group of memory cells, differential parasitic resistance or capacitance of the group of memory cells, a differential program or erase minimum pulse width or duration of the group of memory cells, or the like, or a suitable combination of the foregoing. For differential operations, using the exemplary case of two cells per identifier bit (though the rule can be extended to three or more cells per identifier bit through proportional logic, optionally for generating multi-bit identifier data with suitable numbers of differential cells), the identifier bit can be digitized by assigning a '0' value to identifier bits in which a first memory cell has higher (or lower) native current/on-state resistance/erase voltage/delay frequency/parasitic resistance or capacitance/program or erase speed, etc., and assigning a '1' to identifier bits in which a second memory cell has the higher (or lower) native current/on-state resistance/erase voltage/delay frequency/parasitic resistance or capacitance/program or erase speed, and so forth. Rules for digitizing identifier bits utilizing differential operations on multiple memory cells can be stored in trim instructions 122, in an embodiment or elsewhere in controller 120 or integrated circuit device 100.

Embodiments of the present disclosure provide improved differential programming of multiple resistive switching memory cells that define an identifier bit. In one aspect of such embodiments, array control circuitry 124 is provided that can include a detection circuit to detect a program event(s) for a first of the multiple resistive switching memory cells (or a first group of such cells). Additionally, array control circuitry 124 can include a termination circuit configured to disconnect a second of the multiple resistive switching memory cells (or a second group of such cells) from program voltage in response to detection of the program event(s). This disconnection from program voltage can occur prior to completion of a program cycle associated with the differential programming, as an example (see, for instance, FIGS. 3 through 5, infra). In some aspects of these embodiments, the first memory cell(s) associated with the program event(s) can continue to be connected to the program voltage for a duration of the program cycle. This enables a robust programming of the memory cell(s), enhancing data longevity for the differential programming. In at least some embodiments, array control circuitry 124 (or array(s) 110 itself) can include a common node connected to second terminals of the multiple resistive switching memory cells for the differential programming to facilitate intrinsic suppression of the second of the multiple resistive switching memory cells (or the second group of such cells) in response to the program event, greatly mitigating unexpected program events for the differential programming of the identifier bit (e.g., see FIGS. 6 and 7, infra).

In yet other embodiments, controller 120 can be operable to selectively implement one-time programmable operations on selected PUF bits 112 to render permanent a PUF bit sequence generated with a program event at a set of PUF bits 112 (or, e.g., stored at a set of memory cells in response to generation at other memory cells by a non-program event, such as native leak current or the like). Described differently, a PUF data sequence comprising program and un-programmed bits can be reinforced with a strong program pulse, e.g., a one-time programmable pulse, to make program bits of the PUF data sequence non-erasable and create large sensing margin between the program bits and the un-programmed bits of the PUF data sequence. This can serve to greatly enhance longevity and accurate read cycle counts of the PUF bit sequence.

In still additional embodiments, controller 120 can be operable to establish one or more threshold metric levels (e.g., current level(s), resistance level(s), program voltage level(s), program speed level(s), etc.) for defining identifier bit values (e.g., logic levels; a '0' bit and a '1' bit in the binary context) from sensing operations or program operations performed on identifier memory cells 112, 118, as described herein. As an illustrative example, if an operational characteristic selected to generate identifier bit data is a native leak current, a current value threshold (or small range of values) (e.g., 500 nA, or any other suitable value or range) can be selected and resistive switching devices above the current value threshold can be allocated a '1' identifier bit value and devices below the current value threshold can be allocated a '0' identifier bit value. In other embodiments, a range of threshold values with a lower threshold and an upper threshold (e.g., a lower threshold of 400 nA and an upper threshold of 600 nA, or any other suitable threshold value or range of values) can be utilized. Devices with native current below 400 nA can be allocated a '0' identifier bit value; devices with native current above 600 nA can be allocated a '1' identifier bit value, and devices between 400 nA and 600 nA can be discarded, in an embodiment. In an embodiment, further read operations can use a 500 nA threshold to regenerate the '0' bit values and '1' bit values. Using lower and higher initial threshold values can increase sensing margin and reduce bit error rates, according to embodiments of the present disclosure.

It should be appreciated that a suitable threshold or set of thresholds can be established for other resistive switching device operational characteristics selected for generating identifier bit information. As another (non-limited) illustrative example, a logic level 0 can be associated with a program voltage of 2 volts or higher and a logic level 1 associated with a program voltage of 1.8 volts or below. As stated previously, other suitable thresholds can be used to define logic level values for identifier bits as disclosed herein. In some embodiments, when a large number of resistive switching devices are sensed as part of generating identifier bits, a threshold voltage, current, pulse width etc., can be selected such that approximately half of the devices become associated with a logic level 0 and another half become associated with a logic level 1. In some embodiments, threshold settings can be performed manually by way of controller 120; in other embodiments default threshold settings can be set (optionally stored in trim instructions 122) upon initializing a semiconductor chip.

In addition to the foregoing, controller 120 can be configured to define an arrangement or ordering of resistive switching devices (or groups of resistive switching devices) to create a multi-bit sequence of identifier bits. As one illustrative example, resistive switching devices 0:7 can be read and assigned to bits 0:7 of a bit sequence. In an alternative embodiment—utilizing pairs of switching devices to a define an identifier bit—first resistive switching devices 0:7 in a block of array(s) 110 can be associated with second resistive switching devices (n: n+8) elsewhere in the block of the array(s) 110 (or in another block of the array(s) 110) by controller 120 to define identifier bits 0:7 of a (differential) bit sequence. The variable: n can be any suitable number greater than 7 if in the same block, or any number if in a different block or on a different wordline of the block. However, in particular embodiments the number n can be a multiple of the size of the bit sequence, e.g., for an 8-bit identifier sequence a multiple of n=8:8, 16, 24, 32, ..., 128, 256, 512, and so forth. In other embodiments, the bit sequence need not be derived from resistive switching devices arrayed in a particular order (consecutive or otherwise). As an example, from an ordinal line of resistive switching devices, devices 15, 90, 7, 21, 50, 2, 37, 19 (and suitable associated groups of other resistive switching devices in the differential programming context, where multiple resistive switching devices define each identifier bit) can be read and respectively assigned to bits 0:7 of an output bit string. The bit string can be of any selected length, defined by a matching number of resistive switching devices (or multiples of the matching number in the differential context). For instance, bit strings of 64 bits, 256 bits, 1024 bits, 64 kbits, or any other suitable subset of identifier memory cells 112, 118 up to all of identifier memory cells 112, 118 (which can include all of array(s) 110 of memory in at least some embodiments) may be employed for a bit string. As another non-limiting illustration, for a 256-bit PUF data sequence utilized for a cryptographic key, controller 120 can characterize a set of memory cells as PUF bits and define an ordering of resistive switching memory cells assigned to the PUF bits to correspond with a sequence of 256 bits. Bit values (e.g., logic levels, ...) generated from the assigned resistive switching memory cells can then be ordered by controller 120 consistent with the device(s) ordering to thereby create the 256-bit identifier sequence. As a specific illustration: where a row of 256 resistive switching devices in an array is selected for generating an identifier sequence, identifier bit values of the 256 resistive switching devices can be arranged in the order the resistive switching devices are physically situated in the row; however, this is an illustrative example only and any other suitable arrangement or ordering can be implemented by controller 120 as an alternative or in addition.

In should be understood that operations, configurations, characteristics and various illustrations and descriptions of controller 120 can be applicable to other controllers disclosed herein in various embodiments (e.g., with reference to FIG. 11, infra, memory array 1102 and components of operating environment 1100 configured for control of operations of memory array 1102). Conversely, operations, configurations, characteristics and various illustrations and descriptions of other controllers disclosed herein can be applicable to controller 120 in one or more embodiments.

Although presented briefly above, and now in more detail: rules for establishing a subset of switching devices of array(s) 110 according to a disclosed operational characterization can be stored in trim instructions 122. Trim instructions 122 can comprise rules for storing operational characterizations of the available characterizations of resistive-switching memory cells of array(s) 110, rules for identifying (and storing) memory cell addresses having one of the specified characterizations, rules for performing operations upon characterized switching devices consistent with the characterization, and so forth. For instance, trim instructions 122 can store rules for characterizing one or more groups of resistive switching devices of array(s) 110 as PUF bits 112, rules for coupling multiple resistive switching devices to form differential PUF bits in some embodiments (e.g., see FIGS. 2, 3 and 5, infra), rules for performing a PUF operation on a group of resistive switching devices characterized as PUF bits 112, such as a PUF write (to generate PUF bits) or a PUF read (to read data generated with a PUF write and stored at cells generating the data, stored at a portion of the cells generating the data, or stored at other cells within array(s) of memory 110, according to various embodiments), and rules for re-characterizing resistive switching devices as OTP bits 114, MTP bits 116 or RNG bits 118 previously characterized as PUF bits 112, or as no characterization. Trim instructions 122 can likewise store rules for characterizing one or more groups of resistive switching devices as OTP bits 114, MTP bits 116 or RNG bits 118, rules for coupling multiple resistive switching devices to form differential RNG bits (e.g., in a similar manner as provided herein for differential PUF bits, extended to un-programmed memory cells with low write counts), rules for performing an OTP, MTP or RNG operation, and rules for re-characterizing OTP bits 114, MTP bits 116 or RNG bits 118 as other characterizations (where suitable), or no characterization (e.g., utilizing default or conventional trim instructions in at least one embodiment).

To implement operations on memory cells consistent with a previous characterization, controller 120 can reference saved characterizations for groups of memory cells (e.g., stored in trim instructions 122 or elsewhere on integrated circuit device 100, such as within array(s) 110 itself) and obtain from trim instructions 122 suitable signal characteristics for a memory operation consistent with the characterization. Suitable signal characteristics can include: a voltage magnitude(s), current compliance, signal duration, dynamic voltage pulse as a function of time, and so forth. For a PUF write, for instance, trim instructions 122 can store suitable signal characteristics for various PUF write modalities described herein (e.g., utilizing native current, native electrical resistance, detected program event(s), among others). Trim instructions 122 can also store suitable inhibition signals for memory cells neighboring a cell(s) being operated upon, a termination condition(s) for terminating an operation signal, among other signal operations employed for implementing memory operations or identifier operations on resistive switching devices as known in the art or described herein. Likewise, trim instructions 122 can store suitable signal characteristics, inhibit signal characteristics, termination conditions, and so forth, for other disclosed identifier bit sensing operations. Further, trim instructions 122 can store rules for aggregating multiple memory cells to form a differential identifier bit, for differential PUF or RNG memory operation, and for aggregating groups of multiple memory cells to create multiple differential identifier bits to generate a sequence of PUF data or RNG data. Other operational rules, configurations, settings and the like can be stored in trim instructions 122 as disclosed herein, as known in the art or as reasonably conveyed to one of ordinary skill in the art by way of the context disclosed herein. For instance, trim instructions 122 can specify a subset of multiple memory cells defining a PUF bit (e.g., one memory cell of a pair of memory cells defining the PUF bit; two memory cells of four memory cells defining the PUF bit, etc.) as storing a data value for the PUF bit generated in response to a differential program protocol.

Figure 2:
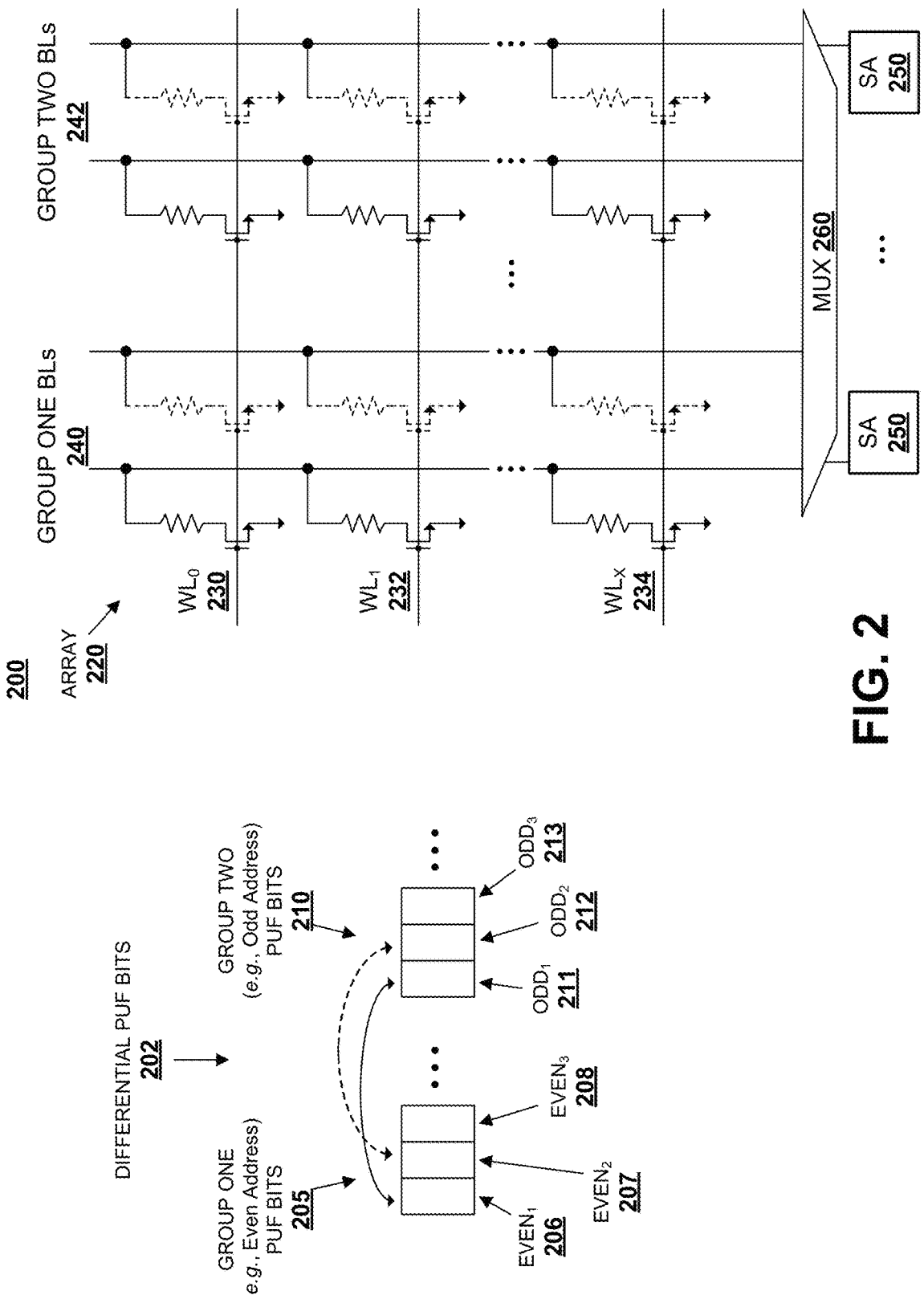
FIG. 2 illustrates a diagram of example arrangements of multiple memory cells defining a differential bit, in further embodiments.

FIG. 2 illustrates a diagram of an example arrangement 200 of differential identifier bits according to alternative or additional embodiments of the present disclosure. Differential identifier bits can be utilized for generating PUF data or for generating RNG data, in various embodiments. On the left-side of FIG. 2 is an illustration of example groups of two-terminal resistive-switching memory cells (in this case, pairs) defining differential PUF bits 202 (also applicable to RNG bits). In the example differential PUF bits 202 illustrated by FIG. 2, a first group of memory cells on even bitlines of an array (e.g., array(s) 110, but see also array 220) are coupled with a second group of memory cells on odd bitlines of the array. Respective pairs of the memory cells from an even bitline and an odd bitline define a differential PUF bit 202, as described herein. It should be understood that the example of FIG. 2 is illustrative only, and not intended to limit the manner or arrangement in which a first memory cell from a first group of an array(s) (e.g., array(s) 110) can be combined with one or more additional memory cells from additional groups of the array(s) to define a differential PUF bit. For instance, the coupling of even and odd bitlines, though a serviceable example, is not intended to limit the creativity of one of ordinary skill in the art to define a differential PUF bit from two or more memory cells, whether on even bitline(s), odd bitline(s), a common wordline or different wordlines, or any other suitable location within an array(s). Rather, all disclosed examples as well as examples not explicitly disclosed but reasonably conveyed to one of ordinary skill by way of the context provided in the present disclosure are within the intended scope of a differential PUF bit 202.

In the example illustrated by FIG. 2, even address portions 205 of differential PUF bits 202 and odd address portions 210 of differential PUF bits 202 are shown. Although illustrated as blocks, the blocks of even and odd address portions 205, 210 represent (one or more) respective resistive switching cells of an array of resistive switching devices 220. The respective resistive switching cells can be the same or similar to cells 322, 324 of FIG. 3 of cells 522, 524 of FIG. 5 in some embodiments, whereas in other embodiments a resistive switching cell can have other arrangements of a resistive switching device and one or more transistors, as well as one or more other analog or digital circuit components suitable for a resistive switching cell known in the art or reasonably conveyed to one of ordinary skill in the art by way of the context presented herein, all of which are considered within the scope of the present disclosure.

Differential PUF bits 202 illustrate three PUF bits and respective even and odd memory cells forming the PUF bits. Even $cell_1$ 206 and odd $cell_1$ 211 form a first PUF bit, even $cell_2$ 207 and odd $cell_2$ 212 form a second PUF bit, and even $cell_3$ 208 and odd $cell_3$ 213 form a third PUF bit. Array 220 illustrates an arrangement of wordlines and bitlines defining an array of multiple resistive switching cells according to some disclosed embodiments. Two differential PUF bits 202, as described above, can be defined from the memory cells illustrated on each wordline of array 220, but it should be understood that many more pairs of differential PUF bits 202 can be defined in an array that is not limited by drawing area constraints, as one of skill in the art would readily understand.

The wordlines include $wordline_0$ 230, $wordline_1$ 232 through $wordline_x$ 234, where x is a suitable integer larger than 1, referred collectively as wordlines 230-234. Likewise, the bitlines include even bitlines 240 and odd bitlines 242. For an embodiment in which two memory cells define a differential PUF bit 202, a first PUF bit 202 can be defined (e.g., on a single wordline) and include a memory cell (e.g., $even_1$ 206) connected to one bitline of even bitlines 240 and a second memory cell (e.g., $odd_1$ 211) connected to one bitline of odd bitlines 242. A second PUF bit 202, can be defined by even and odd memory cells (e.g., $even_2$ 207 and $odd_2$ 212) on the same wordline (e.g., $wordline_0$ 230) adjacent to the memory cell and second memory cell, in an embodiment(s). In alternative embodiments, the second PUF bit 202 can be defined by memory cells that are on non-adjacent bitlines with respect to the memory cell and second memory cell, while still on the same wordline. In still other embodiments, the second PUF bit 202 can be defined by even and odd memory cells on a different wordline (e.g., wordline$_1$ 232). Moreover, any plurality of the PUF bit, second PUF bit, a third PUF bit (e.g., defined by even$_3$ 208 and odd$_3$ 213), or other PUF bits not depicted can form a PUF data sequence (or portion thereof) when on the same wordline in either adjacent or non-adjacent bitlines, or on different wordlines in adjacent or non-adjacent bitlines, or suitable combinations of the foregoing. In still other embodiments, a differential PUF bit can be defined from more than two memory cells of array 220. Where PUF bits of a data sequence reside on different wordlines, suitable inhibition circuitry or signal processes can be provided for array 220 to mitigate or avoid bit disturb effects on memory cells not associated with the data sequence, or PUF bits on a subset of bitlines or wordlines can be operated upon sequentially while inhibiting other portions of the bitlines and wordlines connected to one or more PUF bits, or a suitable combination of the foregoing.

Electrical response of a memory cell can be measured on a bitline connected to the memory cell. As depicted, one or more sense amps 250 can be selectively connected to or disconnected from even bitlines 240 and odd bitlines 242. In various embodiments, a multiplexer 260 or other switching device or circuit (e.g., transistor, or other switch) can electrically connect a sense amp 250 to even bitlines 240, and can connect a second sense amp 250 to odd bitlines 242. Sense amps 250 can be utilized to determine whether voltage or current on a connected bitline changes (e.g., voltage reduces, current increases, and so forth) in a manner indicating a program event has occurred for a memory cell coupled to that connected bitline. In one embodiment, sense amps 250 and multiplexer 260 can be instituted on a ground path for an array 220 (e.g., through transistors 326, 328 connected to wordline 320 in FIG. 3, infra) or sense amps 250 and multiplexer 260 can be instituted on a supply voltage path for the array 220 (e.g., utilizing PMOS transistors 352, 354 coupling bitlines 312A, B to program supply 350 of FIG. 3, or FIG. 5, infra).

Figure 3:
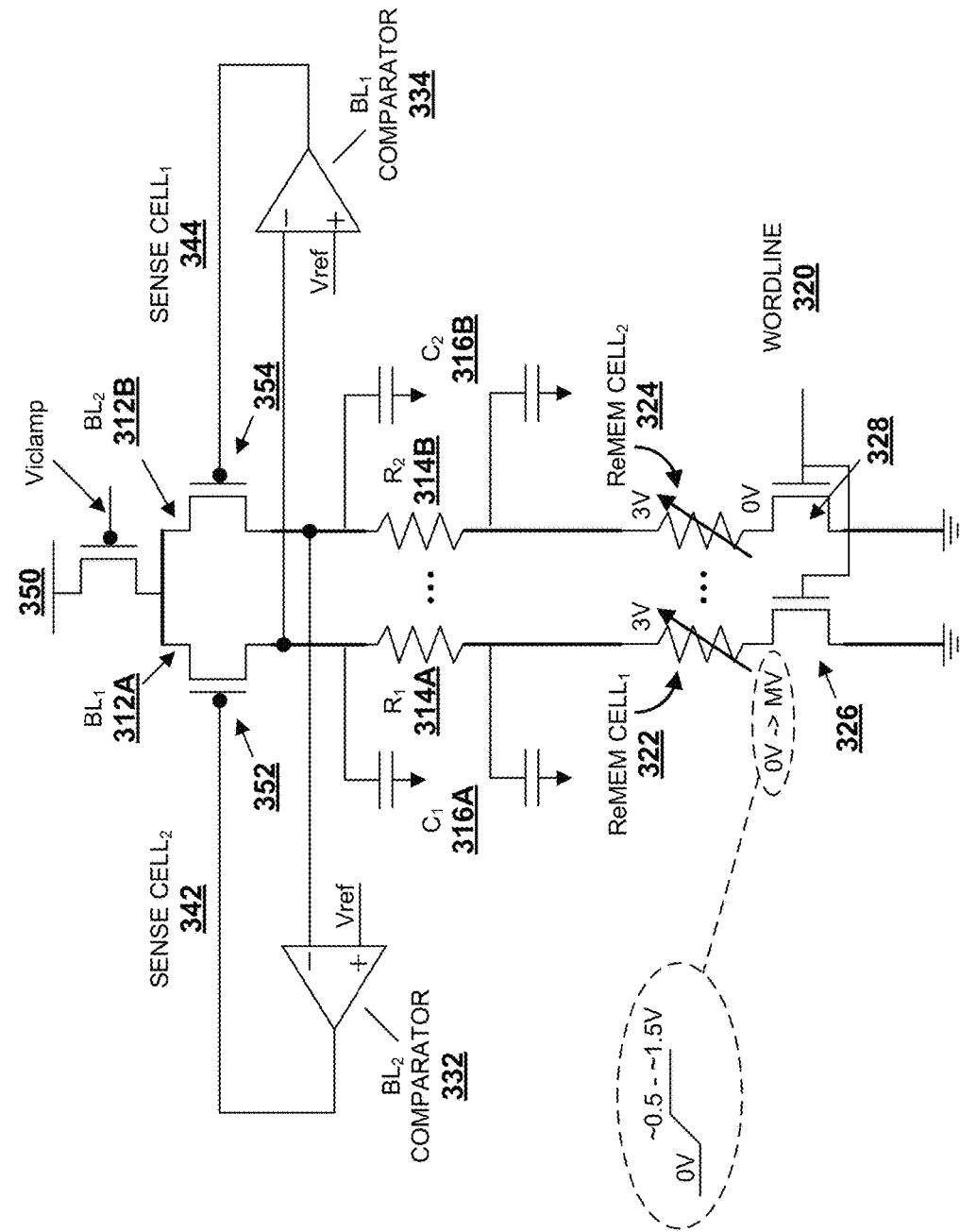
FIG. 3 depicts a schematic diagram of an example differential program circuit with program detection and adjacent path disablement, in various embodiments.

FIG. 3 illustrates a schematic diagram of an example circuit 300 for implementing differential programming of two-terminal resistive switching memory cells, in various embodiments of the present disclosure. Circuit 300 can be configured to sense a program event for one or more memory cells and disconnect a non-programmed cell from a program supply voltage. By disconnecting the non-programmed cell, circuit 300 can reduce a likelihood that more than an expected number of cells becomes programmed. This in turn can mitigate an invalid data result for an identifier bit in response to the differential programming. As an illustrative example, where digitization rules (e.g., stored in trim instructions 122) specify a "0" data value in response to a first memory cell of a pair (or a first pair of four cells, or other suitable sub-group of a larger group) becoming programmed, and a "1" in response to a second memory cell of the pair (or a second pair of the group of four cells, or other sub-group of the larger group) becoming programmed, both cells becoming programmed can be an invalid data result. Likewise, where three cells of a group of four memory cells defining an identifier bit become programmed, an invalid bit can result, and so forth. This example can be extended to non-binary digitization rules as would be anticipated by one of ordinary skill in the art (e.g., a quaternary or base 4 numbering system, a decimal numbering system, hexadecimal numbering system, and so forth, having associated digitization rules based on distinct sub-groups of a group of memory cells defining an identifier bit becoming programmed, and remaining sub-groups being non-programmed). By disconnecting a non-programmed cell(s) once a program event occurs for a cell (or group of cells), invalid bit results can be mitigated or avoided.

In addition, circuit 300 can allow for program soaking of the one or more memory cells for which a program event is sensed. Program soaking refers to the continued application of the program supply voltage to a programmed memory cell, typically for a duration of a program cycle, to attain a robust program event for the programmed memory cell (e.g., embodied by a stable reversible-switching conductive filament within a resistive switching layer of the memory cell, as described herein or known in the art). Program soaking and the robust program event can mitigate or avoid data loss caused by an unstable conductive filament in the non-volatile memory context. As a result, program soaking can help to enhance data longevity, even over many read cycles and long periods of time.

Further to the above, disconnecting a non-programmed cell(s) can reduce power consumption for the differential programming. Where a program supply voltage is supplied to a number of memory cells for a duration of a program cycle, a generally fixed amount of electrical power is consumed. Disconnecting one or more of the memory cells from the program supply voltage before the duration of the program cycle will reduce this power consumption. Accordingly, circuit 300 can serve to provide several advantages for differential programming of multiple two-terminal resistive switching memory cells defining an identifier bit, including: reduced power consumption, enhancing data longevity and reduction of invalid data results.

Circuit 300 comprises a plurality of bitlines, including bitline$_1$ 312A and bitline$_2$ 312B (referred to hereinafter collectively as bitlines 312A, B). Other bitlines between bitlines 312A, B or to the left of bitline$_1$ 312A in an array, or to the right of bitline$_2$ 312B in the array, or stacked above or below bitlines 312A, B in a three dimensional array can be provided as well, according to various aspects of disclosed embodiments.

Each bitline 312A, 312B is connected to a first terminal of at least one two-terminal resistive switching memory cell (also referred to in FIG. 3 as ReMEM cells). As illustrated, bitline$_1$ 312A is connected to a first terminal of a first memory cell: ReMEM cell$_1$ 322 and bitline$_2$ 312B is connected to a first terminal of a second memory cell: ReMEM cell$_2$ 324 (referred to hereinafter collectively as ReMEM cells 322, 324). In one or more embodiments, bitlines 312A, B are selectively connectable to and dis-connectable from ReMEM cells 322, 324 by way of one or more transistors, a multiplexer, or the like (not depicted, but see, e.g., FIG. 11, infra, including row control 1104 and column control 1108, among others). Second terminals of ReMEM cells 322, 324 are selectively connected to and disconnected from a low voltage, or ground, by way of a pair of transistors 326 and 328, respectively. A wordline 320 connected to gate nodes of the transistors 326, 328 can operate to connect the second terminals of ReMEM cells 322, 324 to the low voltage/ground, or isolate the second terminals from the low voltage/ground.

Bitlines 312A, B can also be connected to a voltage supply 350. In various embodiments, bitlines 312A, B can be connected to voltage supply 350 by way of a termination circuit. The termination circuit can include a first transistor 352 configured to selectively connect or disconnect bitline$_1$ 312A to or from voltage supply 350, and can include a second transistor 354 configured to selectively connect or disconnect bitline$_2$ 312B to or from voltage supply 350. In alternative aspects of the disclosed embodiment(s), additional transistors (not depicted) can be provided to selectively connect/disconnect additional bitlines (also not depicted, but see FIG. 2, supra) to voltage supply 350. In yet another alternative aspect, a multiplexer or other suitable circuit can be utilized to selectively connect or disconnect bitlines to or from voltage supply 350, as would be understood in the art or reasonably conveyed to one of ordinary skill in the art by way of the context provided herein.

To implement a differential program operation for ReMEM cells 322, 324 a high voltage can be applied to wordline 320 to activate transistors 326, 328 and thereby connect second terminals of ReMEM cells 322, 324 to low voltage, or ground. In addition, a program voltage can be provided at voltage supply 350, and a Viclamp transistor activated to connect the voltage supply 350 and program voltage to the termination circuit (including first transistor 352 and second transistor 354) and through the termination circuit to bitlines 312A, B. As a result, a voltage approximately equal to the program voltage appears across ReMEM cells 322, 324 (excepting any voltage dropped across resistances 314A, 314B of bitlines 322, 324, respectively).

In response to the program voltage across ReMEM cells 322, 324 one or more of the cells will begin to program. Assuming one programs before the other, in response to programming of one cell a detection circuit can disconnect the other cell from program supply 350 (see also array control circuitry 124 of FIG. 1, supra). This reduces a likelihood that both cells become programmed, producing an invalid data result for an identifier bit comprised of ReMEM cells 322, 324. The detection circuit can include a bitline$_2$ comparator 332, a bitline comparator 334 and cell$_2$ sense output 342 and a cell$_1$ sense output 344. A first (input) node of bitline$_2$ comparator 332 receives as an input a voltage on bitline$_2$ 312B. Bitline, comparator 332 receives on a second (input) node a reference voltage, vref. Likewise, a first (input) node of bitline$_1$ comparator 334 receives as an input a voltage on bitline 312A, and as a second (input) node the vref voltage.

In response to ReMEM cell$_2$ 324 (connected to bitline$_2$ 312B) becoming programmed to a low resistance state, the voltage on bitline$_2$ 312B will be reduced, as will the input into the first node of bitline$_2$ comparator 332. Vref is selected to have a magnitude greater than the reduced voltage on bitline$_2$ 312B that occurs in response to ReMEM cell$_2$ 324 becoming programmed (or ReMEM cell$_1$ 322) to the low resistance state. As a result of ReMEM cell$_2$ 324 becoming programmed then, bitline$_2$ comparator 332 changes cell$_2$ sense output 342 from low to high, which deactivates a PMOS transistor that embodies first transistor 352, in the example embodiment of FIG. 3 (in other embodiments, first transistor 352 can be an NMOS transistor, and bitline$_2$ comparator 332 can be configured to change cell$_2$ sense output 342 from high to low in response to programming of ReMEM cell$_2$ 324, thereby deactivating the NMOS transistor). Deactivation of first transistor 352 isolates bitline$_1$ 312A from voltage supply 350, which disconnects the program voltage from ReMEM cell$_1$ 322. The detection of the program event on bitline$_2$ 312B takes a time proportional to resistance 314B of bitline$_2$ 312B and a capacitance C$_2$ 316B of bitline$_2$ 312B. Likewise, disconnecting the program voltage from ReMEM cell$_1$ 322 involves a ramp down time proportional to the resistance 314A of bitline: 312A and capacitance C$_1$ 316A of bitline$_1$ 312A (see FIG. 5, infra).

Similarly, in response to ReMEM cell$_1$ 322 becoming programmed to the low resistance state, a voltage input to bitline$_1$ comparator 334 drops below the reference voltage vref. Bitline, comparator 334 outputs a deactivation signal (in this embodiment illustrated by FIG. 3, from low voltage to high voltage) for cell$_1$ sense output 344 that deactivates second transistor 354. This in turn isolates bitline$_2$ 312B from voltage supply 350, which disconnects the program voltage from ReMEM cell$_2$ 324. Detection of the program event on bitline$_1$ 312A takes a time proportional to resistance 314A of bitline$_1$ 312A and a capacitance C$_1$ 316A of bitline$_1$ 312A. Likewise, disconnecting the program voltage from ReMEM cell$_2$ 324 involves a ramp down time proportion to the resistance 314B of bitline$_2$ 312B and capacitance C$_2$ 316B of bitline$_2$ 312B.

It is worth noting that circuit 300 can continue to supply program voltage from voltage supply 350 to a programmed memory cell. Because the detection and termination circuits are configured to detect a program event on a first bitline, and disconnect the second bitline from program supply 350, the first bitline still receives the program voltage (see also array control circuitry 124 of FIG. 1, supra). The helps to ensure that the program event detected on the first bitline results in a full, robust programming of the ReMEM cell on that bitline, while reducing a likelihood that both memory cells become programmed in response to the program voltage. Additionally, total power consumption can be reduced for the differential program in response to disconnecting the second bitline from voltage supply 350, as current on the second bitline will drop substantially once disconnected from the voltage supply 350.

Figure 4:
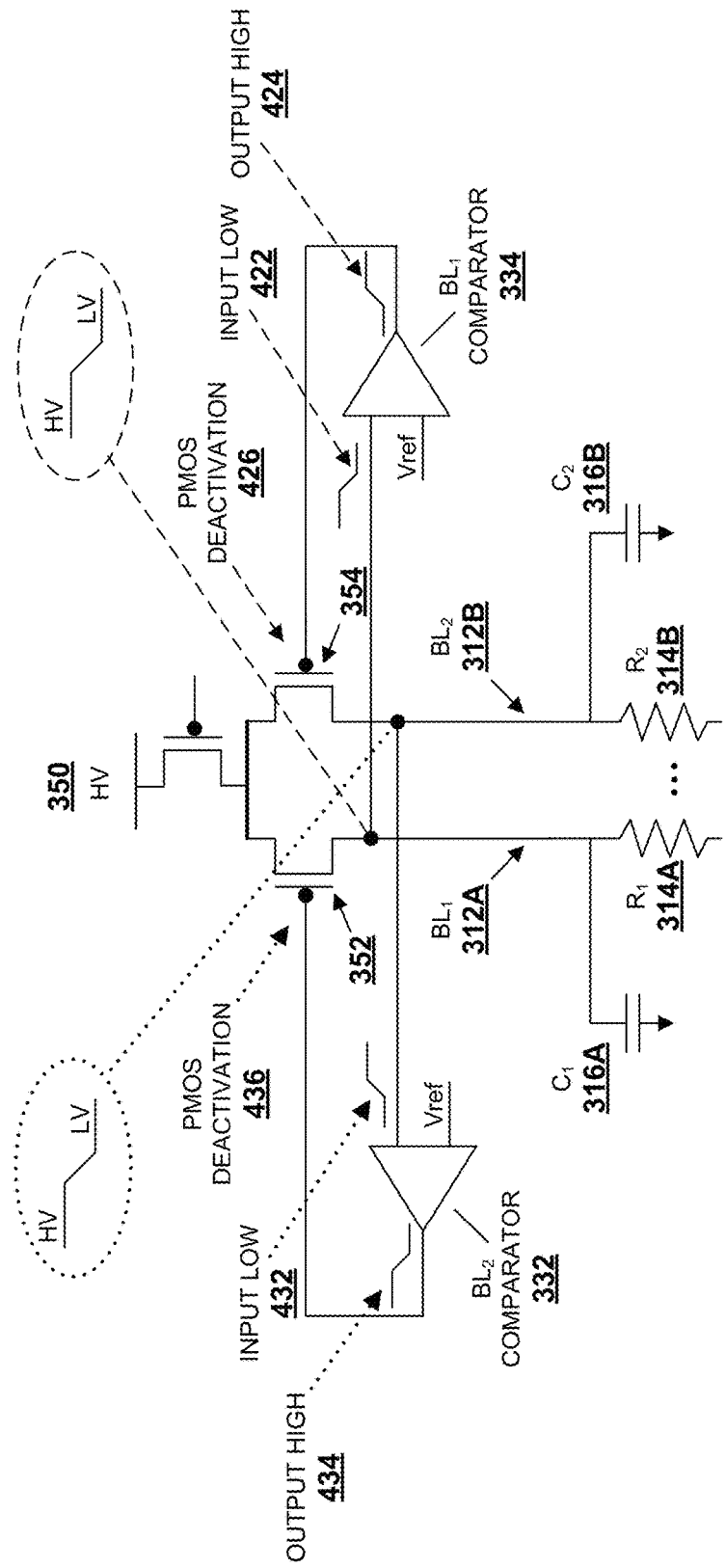
FIG. 4 illustrates a schematic diagram of an example detection and termination circuit for a differential program circuit according to disclosed embodiments.

FIG. 4 depicts a schematic diagram of an example program sensing and adjacent path isolation circuit 400 according to further aspects of the disclosed embodiments. Circuit 400 provides a more detailed illustration of the operation of the detection and termination circuits of FIG. 3, supra. Specifically, circuit 400 includes bitlines 312A, B connected to respective first terminals of ReMEM cells 322, 324 of FIG. 3, as described previously. In response to ReMEM cell$_1$ 322 becoming programmed, bitline, 312A and a first input to bitline comparator 334 go from high voltage HV to low voltage LV, as illustrated by the dashed line callout in FIG. 4. This high to low voltage on the first input of bitline comparator 334 causes a low to high output 424 at an output node of bitline comparator 334, causing PMOS deactivation 426 of second transistor 354. Deactivation of second transistor 354 isolates the high voltage HV at voltage supply 350 from bitline$_2$ 312B. Following deactivation of second transistor 354, first transistor 352 can remain activated (e.g., for a duration of a programming cycle).

Conversely, in response to ReMEM cell$_2$ 324 becoming programmed, bitline$_2$ 312B and a first input to bitline, comparator 332 go from high voltage HV to low voltage LV, as illustrated by the dotted line callout in FIG. 4. This high to low voltage on the first input of bitline$_2$ comparator 332 causes a low to high output 434 at an output node of bitline$_2$ comparator 332, causing PMOS deactivation 436 of first transistor 352. Deactivation of first transistor 352 isolates the high voltage HV at voltage supply 350 from bitline$_1$ 312A. Following deactivation of first transistor 352, second transistor 354 can remain activated (e.g., for a duration of the programming cycle).

Figure 4A:
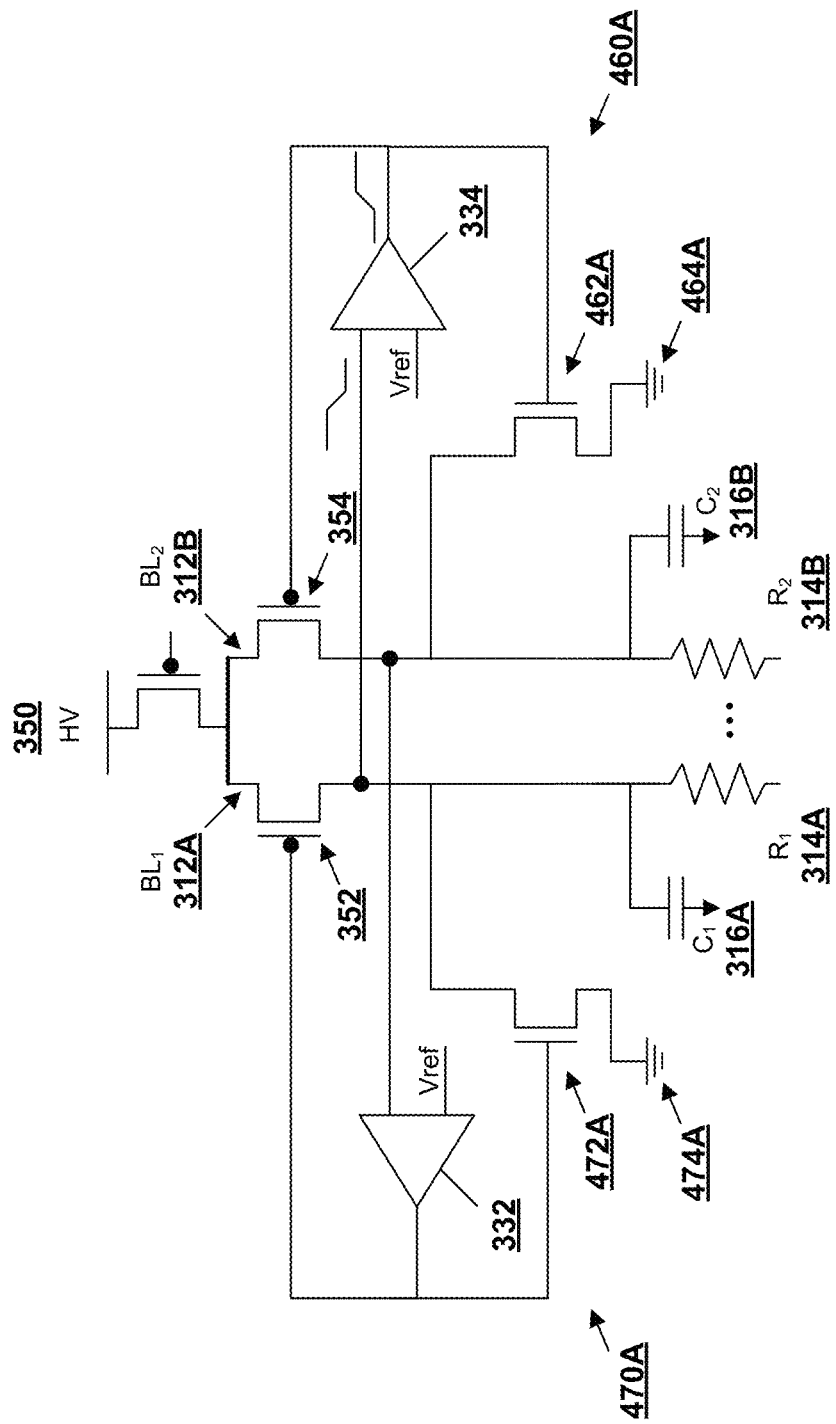
FIG. 4A depicts a schematic diagram of an example circuit 400A providing a bitline pull-down circuit, according to additional embodiments of the present disclosure.

FIG. 4A illustrates an example of a circuit 400A facilitating differential program sensing and adjacent cell termination according to further embodiments of the present disclosure. Circuit 400A includes a pull-down circuit 460A coupled to bitline$_2$ comparator 334 and a pull-down circuit 470A coupled to bitline comparator 332. Pull-down circuits 470A, 460A are configured to rapidly suppress voltage on bitlines 312A, B respectively to overcome long RC time delays in discharging bitlines 312A, B in response to disconnection at PMOS transistors 352, 354. Pull-down circuit 460A includes an NMOS transistor 462A having a gate coupled to an output node of bitline comparator 334, and one channel node (e.g., a source or drain) coupled (directly or indirectly) to bitline$_2$ 312B and a second channel node (e.g., a drain or source, respectively) coupled to ground 464A. In response to the output of bitline$_2$ comparator 334 going high, NMOS transistor 462A is activated connecting bitline$_2$ 312B to ground 464A. Likewise, pull-down circuit 470A includes an NMOS transistor 472A having a gate coupled to an output node of bitline$_2$ comparator 332, and one channel node (e.g., a source or drain) coupled (directly or indirectly) to bitline: 312A and a second channel node (e.g., drain or source, respectively) coupled to ground 474A, which can more rapidly discharge bitline$_1$ 312A than merely disconnecting bitline$_1$ 312A from power supply 350. In response to the output of bitline$_2$ comparator 332 going high, NMOS transistor 472A is activated connecting bitline: 312A to ground 474A, which can more rapidly discharge bitline$_1$ 312A than merely disconnecting from power supply 350.

Figure 5:
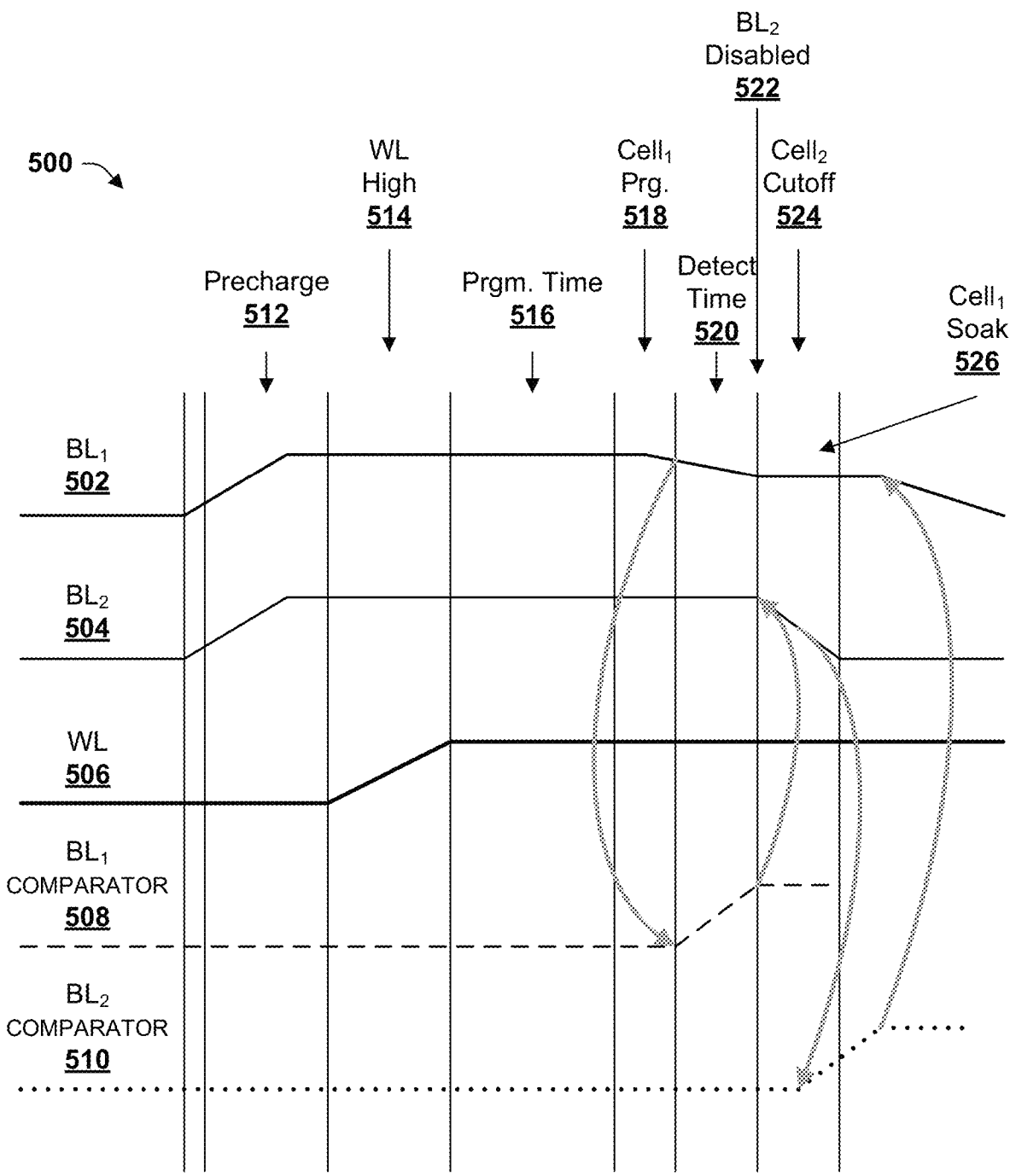
FIG. 5 depicts a sample signal diagram for a differential program circuit according to further embodiments.

FIG. 5 illustrates a graph 500 of voltage versus time for a differential program operation implemented for differential program sensing and adjacent program termination circuit 300, according to further embodiments of the present disclosure. Graph 500 depicts voltage on a vertical (y) axis and time on a horizontal (x) axis. Different stages of a differential program are provided along a top of graph 500, and different nodes at which voltages occur are listed along the left side of graph 500. The different nodes include: bitline$_1$ 502 (also referred to as BL1 502), bitline$_2$ 504 (BL2 504), wordline 506 (WL 506), bitline, comparator output 508 (also Comp1 Out 508) and bitline$_2$ comparator output 510 (Comp2 Out 510).

Each node begins in a low voltage state. At the beginning of a precharge phase 512, voltage begins to increase at BL1 502 and BL2 504, and reaches a maximum voltage (e.g., ~ supply voltage 350) by the end of precharge phase 512. WL 506 receives an increase in voltage during a WL High phase 514, to activate transistors 326 and 328. At an end of WL High phase 514, ReMEM cells 322, 324 are connected to voltage supply 350 at their first terminals and low voltage, or ground, at their second terminals. As a result, approximately the program voltage output by voltage supply 350 appears across ReMEM cells 322, 324 and continues during a program time phase 516.

ReMEM cell$_1$ 322 experiences a program event to a low resistance state at cell$_1$ program phase 518. This is illustrated in FIG. 3 by a transition from low voltage (e.g., about 0 volts) to a moderate voltage (e.g., about 0.5 to about 1.5 volts) for the second terminal of ReMEM cell$_1$ 322, when electrical resistance of ReMEM cell$_1$ 322 decreases significantly in response to the program voltage. As a result, voltage on bitline: 312A is reduced after a time proportional to the resistance R1 314A and capacitance C$_1$ 316A of bitline$_1$ 312A. This time is illustrated by a program detect time 520. During detect time 520, Comp1 Out 508 begins to rise in response to the reduction in voltage on BL1 502. Comp2 Out 510 remains low. After detect time 520, Comp1 Out 508 reaches a high voltage and the termination circuit of FIG. 3 deactivates second transistor 354 causing a reduction in voltage on BL2 504 to zero volts during a cell$_2$ cutoff phase 524. Note that after an initial reduction in voltage on BL1 502 in response to cell$_1$ program phase 518, voltage across ReMEM cell$_1$ 322 stabilizes and continues for a cell$_1$ soak phase 526, where the program voltage continues on BL1 502. After cell$_1$ soak phase 526, a program cycle ends and the remaining voltage discharges from BL1 502.

FIG. 6 illustrates a schematic diagram of an example differential program circuit 600 according to additional embodiments of the present disclosure. Circuit 600 can be configured to implement a differential program process for memory cells defining a differential identifier bit, and detect a program event(s) of one or more memory cells in response to the differential program process. In addition, circuit 600 can disconnect a non-programmed cell(s) from a voltage supply to lower power consumption and mitigate invalid differential program data values. Moreover, circuit 600 can facilitate rapid intrinsic suppression of the non-programmed cell(s) to further minimize the possibility of invalid differential program data values. The intrinsic suppression can reduce a voltage appearing at the non-programmed cell(s) much more rapidly than by disconnecting the supply voltage-even multiple orders of magnitude faster in some aspects of the disclosed embodiments-achieving significant advantages for differential programming of multiple memory cells. The program termination circuit can still achieve the advantage of reducing power consumption for the differential programming in a fixed program cycle, by minimizing current flow through a bitline(s) once the bitline(s) is disconnected from supply voltage.

Similar to circuit 300 of FIG. 3, supra, circuit 600 can comprise bitlines 312A, B including at least bitline$_1$ 312A and bitline$_2$ 312B. Other bitlines can be incorporated within circuit 600 and included within a differential program process, including bitlines between bitlines 312A, B in an array, bitlines to the left of bitline 312A in the array, bitlines to the right of bitline$_2$ 312B in the array, or bitlines above and below bitlines 312A, B (e.g., in or out of the page) in a three-dimensional array.

Resistive memory cells ReMEM 322, 324 have respective first terminals (selectively) coupled to bitlines 312A, B, as described above with respect to FIG. 3. A program detection and termination circuit is provided, including bitline comparators 332, 334 having an input node connected to one of the bitlines 312A, B, and transistors 352, 354 through which bitlines 312A, B are respectively coupled to voltage supply 350 (e.g., by way of a Viclamp transistor, or a multiplexer, or other suitable switching circuit). In response to the detection circuit identifying a program event for one of ReMEM cells 322, 324, the termination circuit can disconnect a bitline of a second of the ReMEM cells 322, 324 from voltage supply 350 by deactivating an associated one of the transistors 352, 354, as described supra.

Bitlines 312A, B have inherent resistance and capacitance: R1 314A and C$_1$ 316A for bitline$_1$ 312A, and R2 314B and C$_2$ 316B for bitline$_2$ 312B, respectively. Values of the inherent resistance and capacitance govern the R*C time delay for electric charge to propagate along bitlines 312A, B and for voltage on the bitlines to increase or decrease over time (e.g., see FIG. 7, infra). For instance, the time for voltage output by voltage supply 350 to appear on bitlines 312A, B is governed by the R*C time delay, as well as the time for voltage to reduce in response to programming of a memory cell to a low resistance state, or time to discharge bitlines 312A, B after disconnection from voltage supply 350. Although an array of memory cells can be constructed having relatively short bitlines 312A, B (e.g., a local bitline), a conventional front-end-of-line (FEOL) or back-end-of-line (BEOL) bitline can be long (e.g., several millimeters or longer)—having high resistance and capacitance. A typical R*C time delay for a non-local bitline may be about 0.5 microseconds (us) or more (e.g., up to about 1.0 microseconds). However, arrays of ReMEM cells 322, 324 constructed from local bitlines or from non-local bitlines, and associated R*C time delays, are within the scope of the present disclosure of circuit 600 (and of circuit 300).

Circuit 600 includes a common node D 610 that electrically interconnects second terminals of ReMEM cells 322, 324. This common node D 610 can be connected to low voltage, or ground, by way of a transistor 615 controlled by wordline 620. By shorting second terminals of ReMEM cells 322, 324, common node D 610 ensures a voltage at one second terminal also appears at the other. Thus, when one of ReMEM cells 322, 324 programs to a low resistance state, a voltage at the second terminal: common node D 610 is pulled up (e.g., from about 0 volts to about 1.5 volts, or other suitable moderate voltage: MV as shown in the dashed line callout of FIG. 6) for both ReMEM cells 322, 324. This can reduce a voltage dropped across a second of ReMEM cells 322, 324 (a non-programmed cell) to below the program voltage associated with programming a two-terminal resistive switching memory cell to a low resistance state. This effectively inhibits subsequent programming of the second (non-programmed) ReMEM cell. Moreover, the increase in voltage from ~0V to MV at common node D 610 can be very rapid, since a short conductor having small R*C delay can be used interconnect a small group of memory cells defining an identifier bit (e.g., two memory cells, four memory cells, eight memory cells, etc.). The short conductor can be two to several (e.g., 5-10) process node dimensions, for example. Moreover, the time for common node D 610 to increase to the moderate voltage can be less than 20 nanoseconds (ns), less than 15 ns, less than 10 ns, in a range from 5-10 ns, or about 5 ns plus or minus 1-2 ns, or any suitable value or range there between.

Similar to circuit 300, circuit 600 can facilitate program soaking of the programmed cell. Thus, where ReMEM cell$_2$ 324 becomes programmed in response to a program voltage, the detection and termination circuit disconnects bitline: 312A and ReMEM cell$_1$ 322 from supply voltage 350 by way of BL2 comparator 332 and transistor 352, as described herein. Moreover, transistor 354 can remain active, thereby maintaining the program voltage at bitline$_2$ 312B and ReMEM cell$_2$ 324 for a duration of a program cycle, also referred to as program soaking. Maintaining the program voltage at ReMEM cell$_2$ 324 facilitates formation of a robust conductive filament and can enhance data longevity.

Figure 6A:
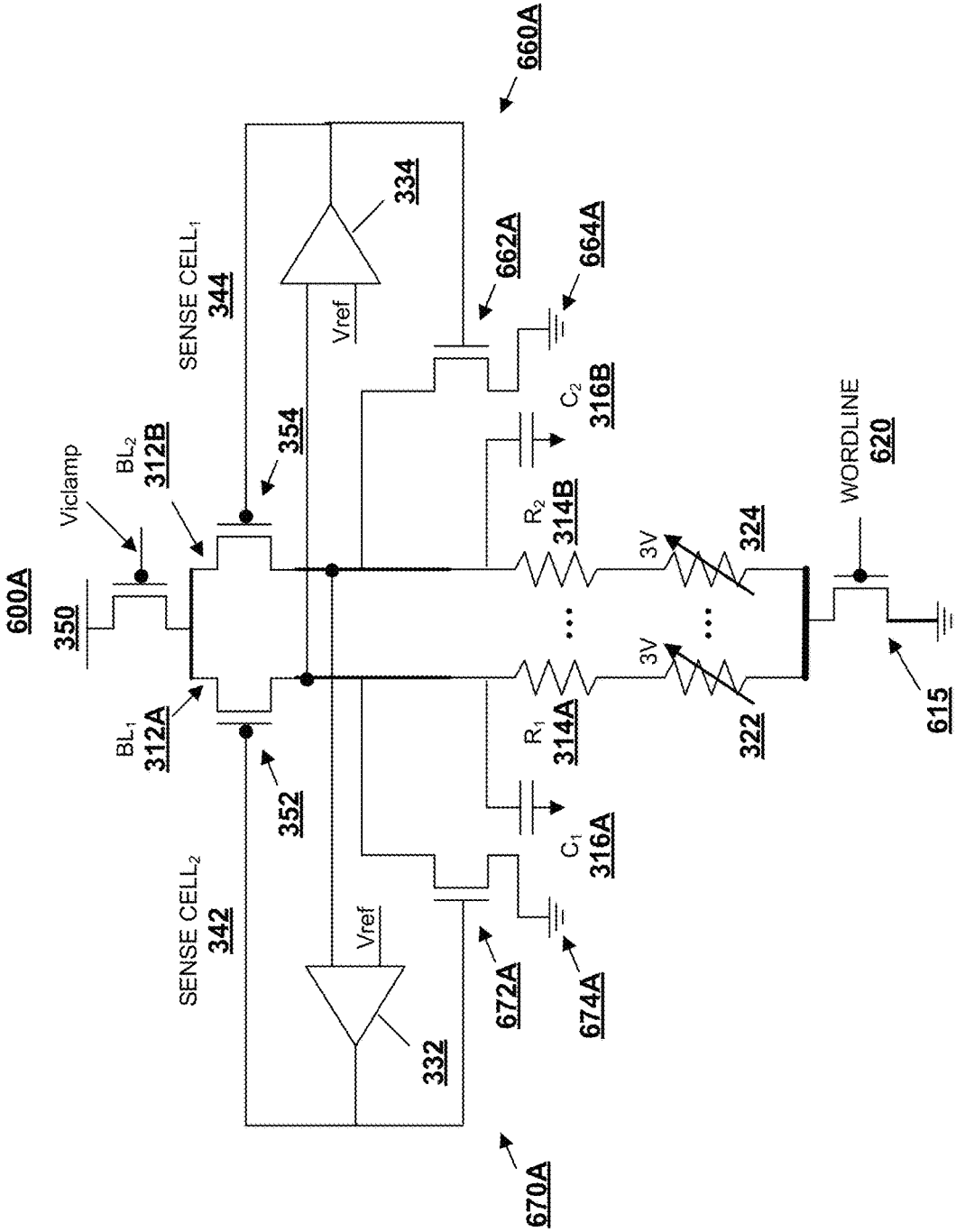
FIG. 6A illustrates a schematic diagram of an example circuit 600A providing a bitline pull-down circuit, according to still further embodiments of present disclosure.

FIG. 6A illustrates an example of a circuit 600A facilitating differential program sensing and adjacent cell termination according to further embodiments of the present disclosure. Circuit 600A includes a pull-down circuit 660A coupled to bitline comparator 334 and a pull-down circuit 670A coupled to bitline, comparator 332. Pull-down circuits 670A, 660A are configured to rapidly suppress voltage on bitlines 312A, B respectively to overcome long RC time delays in discharging bitlines 312A, B in response to disconnection at PMOS transistors 352, 354. Pull-down circuit 660A includes an NMOS transistor 662A having a gate coupled to an output node of bitline comparator 334, and one channel node (e.g., a source or drain) coupled (directly or indirectly) to bitline$_2$ 312B and a second channel node (e.g., a drain or source, respectively) coupled to ground 664A. In response to the output of bitline$_1$ comparator 334 going high, NMOS transistor 662A is activated connecting bitline$_2$ 312B to ground 664A. Likewise, pull-down circuit 670A includes an NMOS transistor 672A having a gate coupled to an output node of bitline$_2$ comparator 332, and one channel node (e.g., a source or drain) coupled (directly or indirectly) to bitline 312A and a second channel node (e.g., drain or source, respectively) coupled to ground 674A, which can more rapidly discharge bitline$_1$ 312A than merely disconnecting bitline$_1$ 312A from power supply 350. In response to the output of bitline? comparator 332 going high, NMOS transistor 672A is activated connecting bitline$_1$ 312A to ground 674A, which can more rapidly discharge bitline$_1$ 312A than merely disconnecting from power supply 350.

Figure 7:
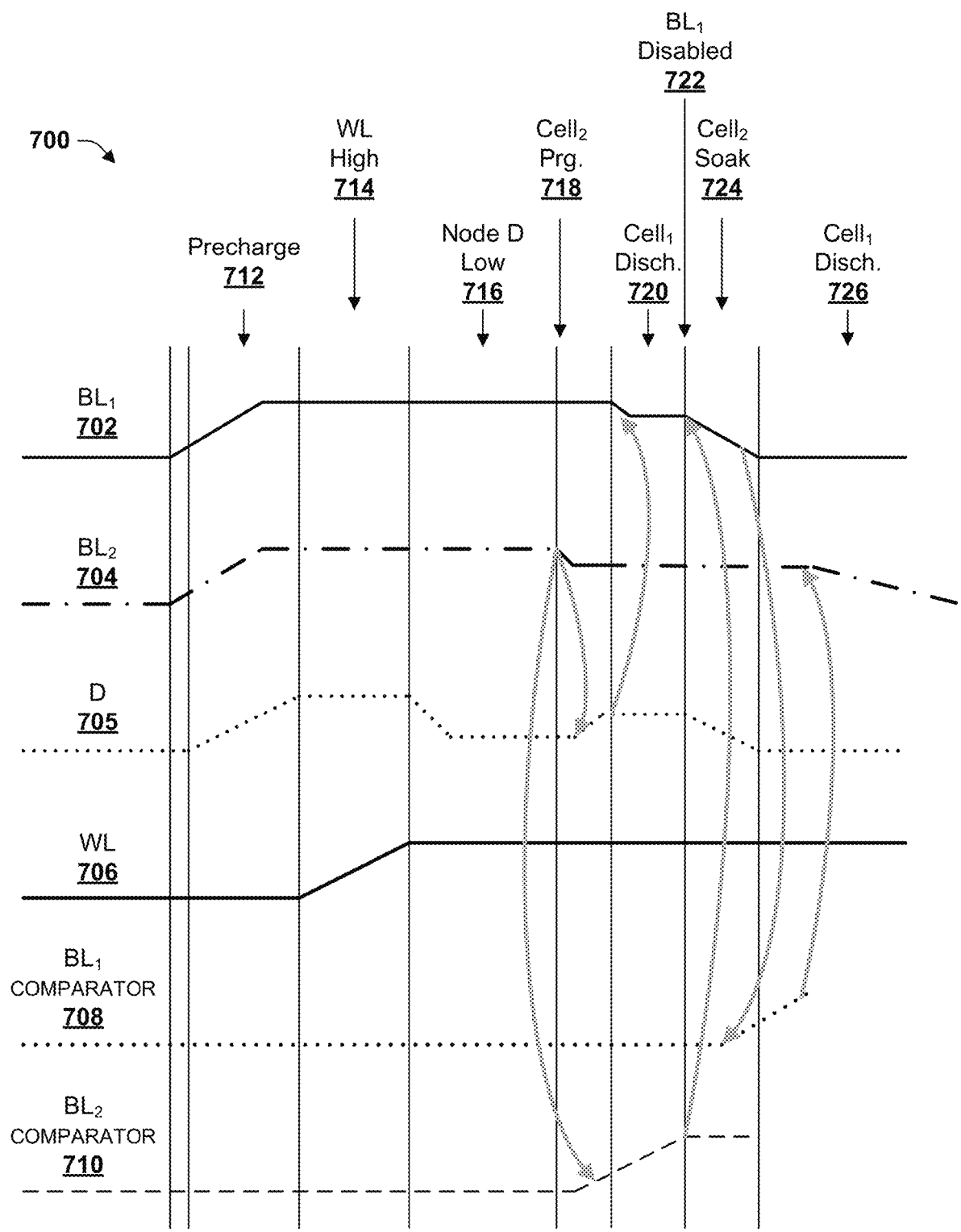
FIG. 7 provides an example signal diagram for the differential program circuit of FIG. 6, in another embodiment.

FIG. 7 depicts a graph 700 of voltage versus time for a differential program operation according to further embodiments of the present disclosure. The differential program represented by graph 700 includes sensing of a programmed cell(s), adjacent program termination as well as intrinsic program suppression of a non-programmed cell(s). Graph 700 depicts voltage on a vertical (y) axis and time on a horizontal (x) axis. Different stages of a differential program are provided along a top of graph 700, and different nodes at which voltages occur are listed along the left side of graph 700. The different nodes include: BL1 702, BL2 704, common node D (D) 705, wordline (WL) 706, Comp1 Out 708 and Comp2 Out 710.

The differential program begins in a low voltage state at each node. At the beginning of a precharge phase 712, voltage begins to increase at BL1 702, BL2 704 and at node D 705. A max voltage is achieved at BL1 702, BL2 704 and D 705 by an end of precharge phase 712. Voltage is supplied on WL 706 during a WL high phase 714, and D 705 is approximately at constant voltage. When WL 706 reaches a suitable voltage, transistor 615 activates and connects D 705 to low voltage (or ground). As a result, voltage at D 705 decreases during a node D low phase 716. In the example differential program process illustrated by FIG. 7, RcMEM cell$_2$ 324 becomes programmed initiating a cell$_2$ program phase 718, pulling up voltage on node D 705. This causes a discharge on ReMEM cell$_1$ 322 during a cell$_1$ discharge phase 720, whereas ReMEM cell$_2$ 324 reduces to a moderate voltage in response to becoming programmed. The discharge on ReMEM cell$_1$ 322 results in a voltage increase at Comp2 Out 710, whereas Comp1 Out 708 remains low. Bitline is disabled at 722 in response to Comp2 Out 710 reaching high voltage and the termination circuit deactivating transistor 352. As a result, bitline discharges following disconnection from voltage supply 350, as does D 705. Bitline$_2$ continues to receive voltage supply 350 during a cell$_2$ soak phase 724, after which voltage supply 350 turns off at the end of a program cycle, causing bitline$_2$ to discharge.

The diagrams included herein are described with respect to several circuits, controllers, interfaces and arrays of resistive switching devices or an integrated circuit device(s) comprising multiple circuits, controllers, interfaces or arrays. It should be appreciated that such diagrams can include those circuits, controllers, etc., specified therein, some of the specified circuits/controllers/interfaces/arrays, or additional circuits/controllers/interfaces/arrays not explicitly depicted but known in the art or reasonably conveyed to those of skill in the art by way of the context provided herein. Components of disclosed integrated circuit devices can also be implemented as sub-components of another disclosed component (e.g., input 140 and output 150 can be sub-components of controller 120), whereas other components disclosed as sub-components can be separate components in various embodiments (e.g., PUF bits 112, OTP bits 114, MTP bits 116 and RNG bits 118 can be separate arrays as opposed to portions of array(s) 110). Further, embodiments within a particular Figure of the present specification can be applied in part or in whole to other embodiments depicted in other Figures without limitation, subject only to suitability to achieving a disclosed function or purpose as understood by one of skill in the art, and vice versa. As illustrative (and non-limiting) examples, array control circuitry 124 of FIG. 1 can be embodied by bitline comparators 332, 334 and transistors 352, 354 of FIG. 3 or 6; array 220 of FIG. 2 can be incorporated within circuit 300 of FIG. 5 or circuit 600 of FIG. 6; array(s) 110 of resistive switching memory cells as depicted in FIG. 1 can be populated with differential PUF bits 202 or array 220; array(s) 110 can be operably coupled with controller 120 as depicted or with controller 120 and some or all array control components of FIG. 11 (e.g., row control 1104, sense amps 1108, column control 1106, clock source(s) 1110, address register 1114, reference and control signal(s) generator 1118, state machine 1120, input/output buffer 1112, command interface 1116), or substituted for memory array 1102 of FIG. 11, or volatile memory 1210A or non-volatile memory 1210B of FIG. 12, or suitable components of operating and control environment 1100 or environment 1200 can be substituted or added to other components or integrated circuit devices disclosed herein, and so forth. Additionally, it is noted that one or more disclosed processes can be combined into a single process providing aggregate functionality. For instance, a write process can comprise a read-verify process, or vice versa, to facilitate storing data at memory or generating data within memory and reading that stored/generated data, by way of a single process. Components of the disclosed architectures can also interact with one or more other components not specifically described herein but known by those of skill in the art.

In view of the exemplary diagrams described supra, process methods that can be implemented in accordance with the disclosed subject matter will be better appreciated with reference to the flow charts of FIGS. 8-10A. While for purposes of simplicity of explanation, the methods of FIGS. 8-10A are shown and described as a series of blocks, it is to be understood and appreciated that the claimed subject matter is not limited by the order of the blocks, as some blocks may occur in different orders or concurrently with other blocks from what is depicted and described herein. Moreover, not all illustrated blocks may be required to implement the methods described herein, and in some embodiments additional steps known in the art or reasonably conveyed to one of ordinary skill in the art by way of the context provided herein can be implemented as part of a disclosed method within the scope of the present disclosure. Moreover, some steps illustrated as part of one process can be implemented for another process where suitable; other steps of one or more processes can be added or substituted in other processes disclosed herein within the scope of the present disclosure. Additionally, it should be further appreciated that the methods disclosed throughout this specification are capable of being stored on an article of manufacture to facilitate transporting and transferring such methodologies to an electronic device, stored in embedded memory within the electronic device, and so forth. The term article of manufacture, as used, is intended to encompass a computer program accessible from any computer-readable device, device in conjunction with a carrier, or storage medium, or the like.

Figure 8:
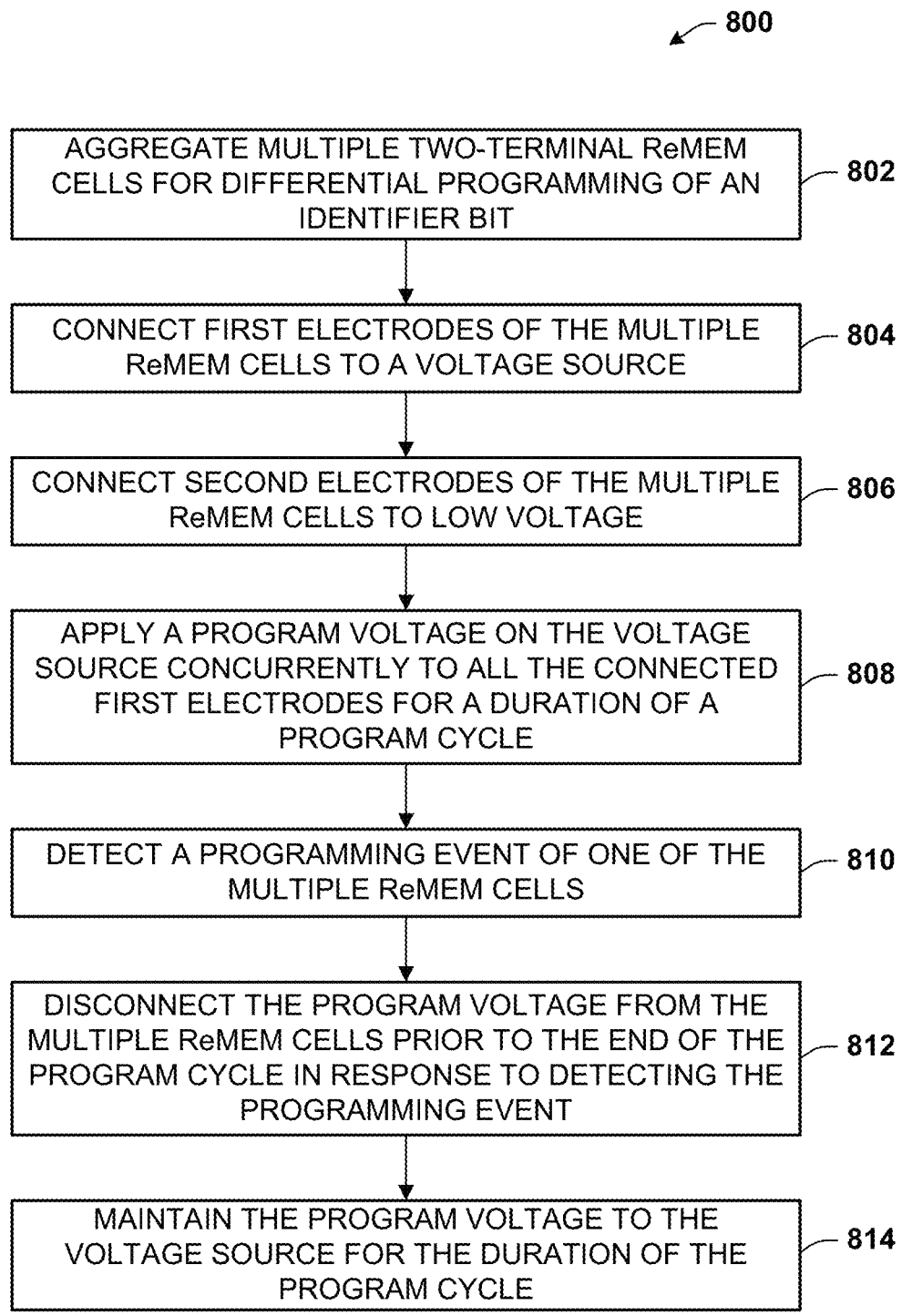
FIG. 8 illustrates a flowchart of an example method for differential programming of a plurality of resistive switching memory cells, in further embodiments.

FIG. 8 illustrates a flowchart of a sample method 800 for implementing one or more embodiments of the present disclosure. At 802, method 800 can comprise aggregating multiple two-terminal resistive switching memory cells for differential programming. The multiple memory cells can define an identifier bit, in various disclosed embodiments. For instance, the multiple memory cells can define a PUF bit in some embodiments, or can define a RNG bit in other embodiments.

At 804, method 800 can comprise connecting a first terminal of a first two-terminal memory of the multiple memory cells to a voltage source, and connecting a first terminal of a second two-terminal memory of the multiple memory cells to the voltage source. In at least one embodiment, the first two-terminal memory and the second two-terminal memory define an identifier bit. In other embodiments, additional memory cells of the multiple memory cells can—together with the first and second two-terminal memories—define the identifier bit.

At 806 method 800 can comprise connecting a second terminal of the first two-terminal memory and a second terminal of the second two-terminal memory to a low voltage, or ground. In one aspect of disclosed embodiments, the second terminals can be connected to the low voltage or ground by way of respective switches (e.g., respective transistors, a multiplexer, or the like). In an alternative aspect of disclosed embodiments, the second terminals can be connected by a common node that electrically couples the second terminals, and the common node can be connected to the low voltage, or ground.

At 808, method 800 can further comprise applying a program voltage on the voltage source concurrently to the first terminal of the first two-terminal memory and to the first terminal of the second two-terminal memory. At 810, method 800 can comprise detecting a programming event for one of: the first two-terminal memory and the second two-terminal memory. In addition to the foregoing, method 800, at 812, can comprise disconnecting the voltage source from a second of: the first two-terminal memory and the second two-terminal memory in response to detecting the programming event. In an embodiment, disconnecting the voltage source can be implemented prior to a duration of the program cycle coming to an end. In a further embodiment, method 800 can additionally comprise activating a pull-down circuit to couple to ground the second of: the first two-terminal memory and the second two-terminal memory in response to detecting the programming event. At 814, method 800 can comprise maintaining the program voltage to the one of the first two-terminal memory and the second two-terminal memory for the duration of the program cycle.

In various embodiments, connecting the first terminal of the first two-terminal memory and the first terminal of the second two-terminal memory to the voltage source can further comprise connecting the first terminal of the first two-terminal memory to a first switch, connecting the first switch to the voltage source and closing the first switch. Additionally, the method can comprise connecting the first terminal of the second two-terminal memory to a second switch, connecting the second switch to the voltage source and closing the second switch. In addition to the foregoing, detecting the programming event can further comprise detecting a reduction in voltage dropped across the first two-terminal memory below a threshold voltage, or detecting a reduction in voltage dropped across the second two-terminal memory below the threshold voltage. In additional aspects, disconnecting the program voltage can further comprise at least one of: opening the second switch in response to detecting the reduction in voltage dropped across the first two-terminal memory, or opening the first switch in response to detecting the reduction in voltage dropped across the second two-terminal memory.

In still additional embodiments, method 800 can comprise, as part of connecting the second terminal of the first two-terminal memory and the second terminal of the second two-terminal memory to the low voltage (or ground), connecting the second terminals of the first and second two-terminal memories to a common node. Additionally, method 800 can comprise connecting the common node to a switch that is coupled to the low voltage (or ground), and closing the switch to couple the common node to the low voltage (or ground).

Figure 9:
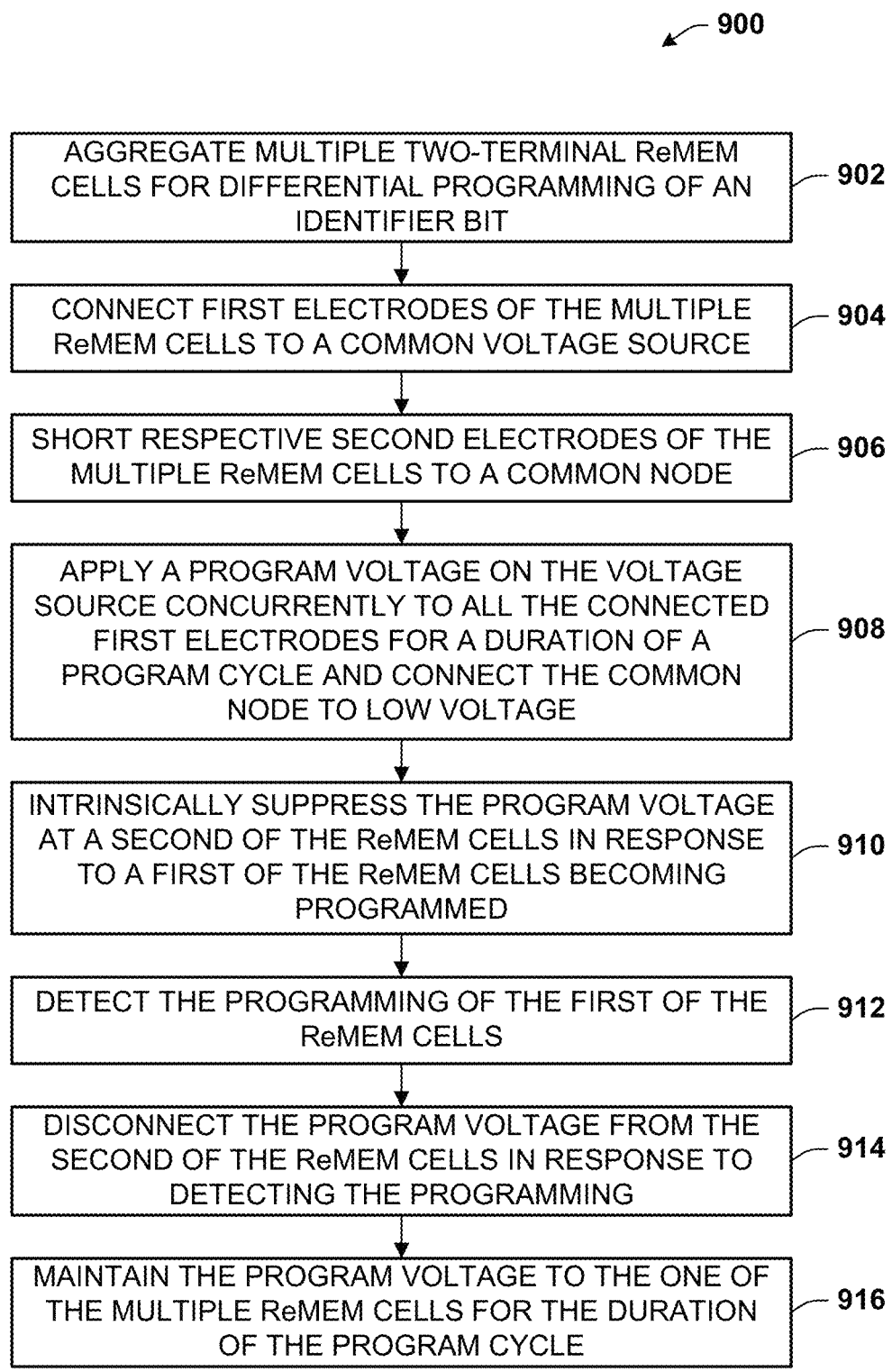
FIG. 9 depicts a flowchart of an illustrative method for differential programming with adjacent path disconnection and intrinsic suppression, in an embodiment.

FIG. 9 depicts a flowchart of an example method 900 for programming a physical unclonable feature (PUF) bit defined by a plurality of two-terminal resistive switching memory cells, according to still further embodiments of the present disclosure. At 902, method 900 can comprise aggregating multiple two-terminal resistive switching memory cells to define a PUF bit, and at 904, method 900 can comprise first electrodes of the multiple two-terminal memory cells to a voltage source. The first electrodes can be connected to the voltage source through respective transistors, through a multiplexer, or other suitable switching circuit. At 906, method 900 can comprise shorting respective second electrodes of the multiple two-terminal resistive switching memory cells to a common node.

At 908, method 900 can comprise applying a program voltage at the voltage source concurrently to the two-terminal resistive switching memory cells, and connecting the common node to low voltage (or ground). At 910, method 900 can comprise intrinsically suppressing the program voltage at a second of the memory cells in response to a first of the memory cells becoming programmed. At 912, method 900 can comprise detecting the programming of the first of the memory cells and, at 914, method 900 can comprise disconnecting the program voltage from the second of the memory cells in response to detecting the programming. In an embodiment, method 900 can additionally comprise activating a pull-down circuit to couple to ground the second of the memory cells in response to detecting the programming event. In addition to the foregoing, method 900 can comprise maintaining the program voltage to the one of the multiple memory cells for the duration of the program cycle.

Figure 10:
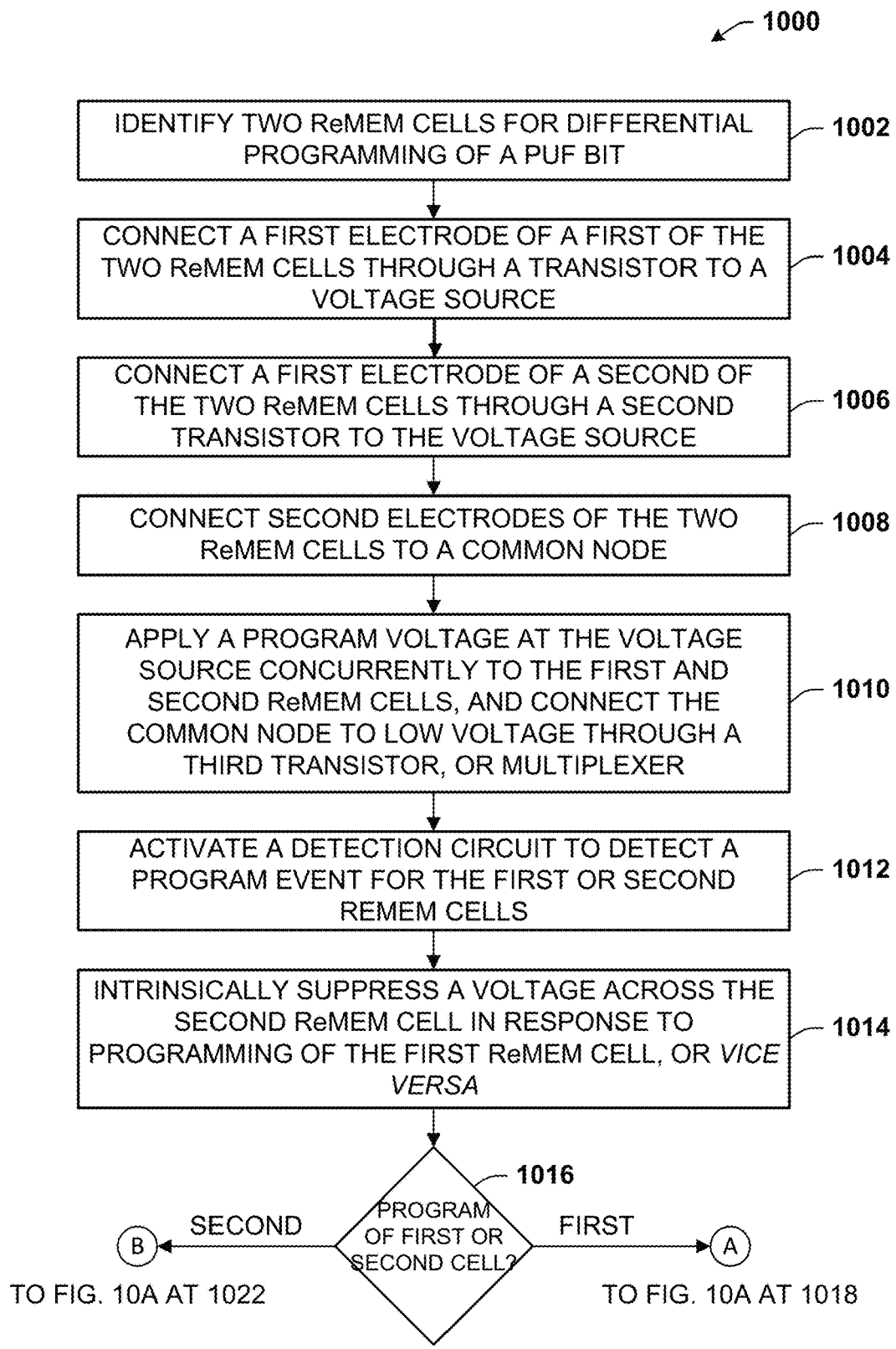

FIGS. 10 and 10A illustrate a flowchart of a sample method 1000 according to still other embodiments of the present disclosure. At 1002, method 1000 can comprise identifying two resistive switching memory cells of an array of two-terminal resistive switching memory cells that define a PUF bit, for differential programming. At 1004, method 1000 can comprise connecting a first electrode of a first of the memory cells through a transistor to a voltage source. At 1006, method 1000 can comprise connecting a first electrode of a second of the memory cells through a second transistor to the voltage source. At 1008, method 1000 can comprise connecting second electrodes of the first memory cell and of the second memory cell indirectly to a low voltage. In some embodiments, the second electrodes can be connected to a common node that electrically shorts the second electrodes, and connects the common node to the low voltage through a transistor, multiplexer, switch, etc. In other embodiments, the second electrodes can be connected to respective transistors (or a multiplexer, or non-transistor switches) and can respectively be connected to the low voltage.

At 1010, method 1000 can comprise applying a program voltage at the voltage source concurrently to the first memory cell and to the second memory cell. At 1012, method 1000 can comprise activating a detection circuit to detect a program event for the first or second memory cells. At 1014, method 1000 can optionally comprise intrinsically suppressing a voltage across a second of the memory cells in response to programming of a first of the memory cells (or vice versa). In a further embodiment, intrinsically suppressing the voltage across the second of the memory cells occurs within about 10 nanoseconds following the programming of the first of the memory cells to a low resistance state. At 1016, method 1000 can determine whether the detection circuit detects the program event for the first memory cell or from the second memory cell. If the program event is detected for the first memory cell, method 1000 can proceed to FIG. 10A at 1018; otherwise, if the program event is detected for the second memory cell, method 1000 can proceed to FIG. 10A at 1022.

Referring to FIG. 10A, at 1018, method 1000 can comprise deactivating the second transistor in response to detecting the program event for the first memory cell. At 1020, method 1000 can comprise disconnecting the program voltage from the second memory cell in response to deactivation of the second transistor. In an embodiment, disconnecting the program voltage from the second memory cell occurs in a range from about 0.5 microseconds to about 1.0 microseconds following detecting the program event for the first memory cell. From 1020, method 1000 can proceed to reference number 1026. At 1022, method 1000 can comprise deactivating the first transistor in response to detecting the program event for the second memory cell. At 1024, method 1000 can comprise disconnecting the program voltage from the first memory cell in response to deactivation of the first transistor. From 1024, method 1000 can proceed to reference number 1026.

At 1026, method 1000 can comprise continue applying the program signal for a program cycle duration. At 1028, method 1000 can comprise terminating the program signal and disconnecting the second electrodes of the first and second memory cells from the low voltage. At 1030, method 1000 can optionally comprise designating either the first or the second memory cell as storing a state of the PUF bit. At 1032, method 1000 can optionally comprise re-allocating the second or the first memory cell, respectively, for other data, including another identifier bit, an OTP data bit, or an MTP data bit.

Example Operating Environments

FIG. 11 illustrates a block diagram of an example operating and control environment 1100 for a memory array 1102 of a memory device according to aspects of the subject disclosure. Control environment 1100 and memory array 1102 can be formed within a single semiconductor die in some embodiments, although the subject disclosure is not so limited and in other embodiments some components of control environment 1100 can be formed on a separate semiconductor die. In at least one aspect of the subject disclosure, memory array 1102 can comprise memory selected from a variety of memory cell technologies. In at least one embodiment, memory array 1102 can comprise a two-terminal memory technology, arranged in a compact two or three-dimensional architecture. Suitable two-terminal memory technologies can include resistive-switching memory, conductive-bridging memory, phase-change memory, organic memory, magneto-resistive memory, or the like, or a suitable combination of the foregoing. In a further embodiment, the two-terminal memory technology can be a two-terminal resistive switching technology.

A column controller 1106 and sense amps 1108 can be formed adjacent to memory array 1102. Moreover, column controller 1106 can be configured to activate (or identify for activation) a subset of bit lines of memory array 1102. Column controller 1106 can utilize a control signal(s) provided by a reference and control signal generator(s) 1118 to activate, as well as operate upon, respective ones of the subset of bitlines, applying suitable program, erase or read voltages to those bitlines. Non-activated bitlines can be kept at an inhibit voltage (also applied by reference and control signal generator(s) 1118), to mitigate or avoid bit-disturb effects on these non-activated bitlines.

In addition, operating and control environment 1100 can comprise a row controller 1104. Row controller 1104 can be formed adjacent to and electrically connected with word lines of memory array 1102. Also utilizing control signals of reference and control signal generator(s) 1118, row controller 1104 can select one or more rows of memory cells with a suitable selection voltage. Moreover, row controller 1104 can facilitate program, erase or read operations by applying suitable voltages at selected word lines.

Sense amps 1108 can read data from, or write data to, the activated memory cells of memory array 1102, which are selected by column control 1106 and row control 1104. Data read out from memory array 1102 can be provided to an input/output buffer 1112. Likewise, data to be written to memory array 1102 can be received from the input/output buffer 1112 and written to the activated memory cells of memory array 1102.

A clock source(s) 1110 can provide respective clock pulses to facilitate timing for read, write, and program operations of row controller 1104 and column controller 1106. Clock source(s) 1110 can further facilitate selection of word lines or bit lines in response to external or internal commands received by operating and control environment 1100. Input/output buffer 1112 can comprise a command and address input, as well as a bidirectional data input and output. Instructions are provided over the command and address input, and the data to be written to memory array 1102 as well as data read from memory array 1102 is conveyed on the bidirectional data input and output, facilitating connection to an external host apparatus, such as a computer or other processing device (not depicted, but see e.g., computer 1202 of FIG. 12, infra).

Input/output buffer 1112 can be configured to receive write data, receive an erase instruction, receive a status or maintenance instruction, output readout data, output status information, and receive address data and command data, as well as address data for respective instructions. Address data can be transferred to row controller 1104 and column controller 1106 by an address register 1114. In addition, input data is transmitted to memory array 1102 via signal input lines between sense amps 1108 and input/output buffer 1112, and output data is received from memory array 1102 via signal output lines from sense amps 1108 to input/output buffer 1112. Input data can be received from the host apparatus, and output data can be delivered to the host apparatus via the I/O bus.

Commands received from the host apparatus can be provided to a command interface 1116. Command interface 1116 can be configured to receive external control signals from the host apparatus and determine whether data input to the input/output buffer 1112 is write data, a command, or an address. Input commands can be transferred to a state machine 1120.

State machine 1120 can be configured to manage programming and reprogramming of memory array 1102 (as well as other memory banks of a multi-bank memory array). Instructions provided to state machine 1120 are implemented according to control logic configurations, enabling state machine 1120 to manage read, write, erase, data input, data output, and other functionality associated with memory cell array 1102. In some aspects, state machine 1120 can send and receive acknowledgments and negative acknowledgments regarding successful receipt or execution of various commands. In further embodiments, state machine 1120 can decode and implement status-related commands, decode and implement configuration commands, and so on.

To implement read, write, erase, input, output, etc., functionality, state machine 1120 can control clock source(s) 1110 or reference and control signal generator(s) 1118. Control of clock source(s) 1110 can cause output pulses configured to facilitate row controller 1104 and column controller 1106 implementing the particular functionality. Output pulses can be transferred to selected bit lines by column controller 1106, for instance, or word lines by row controller 1104, for instance.

Figure 12:
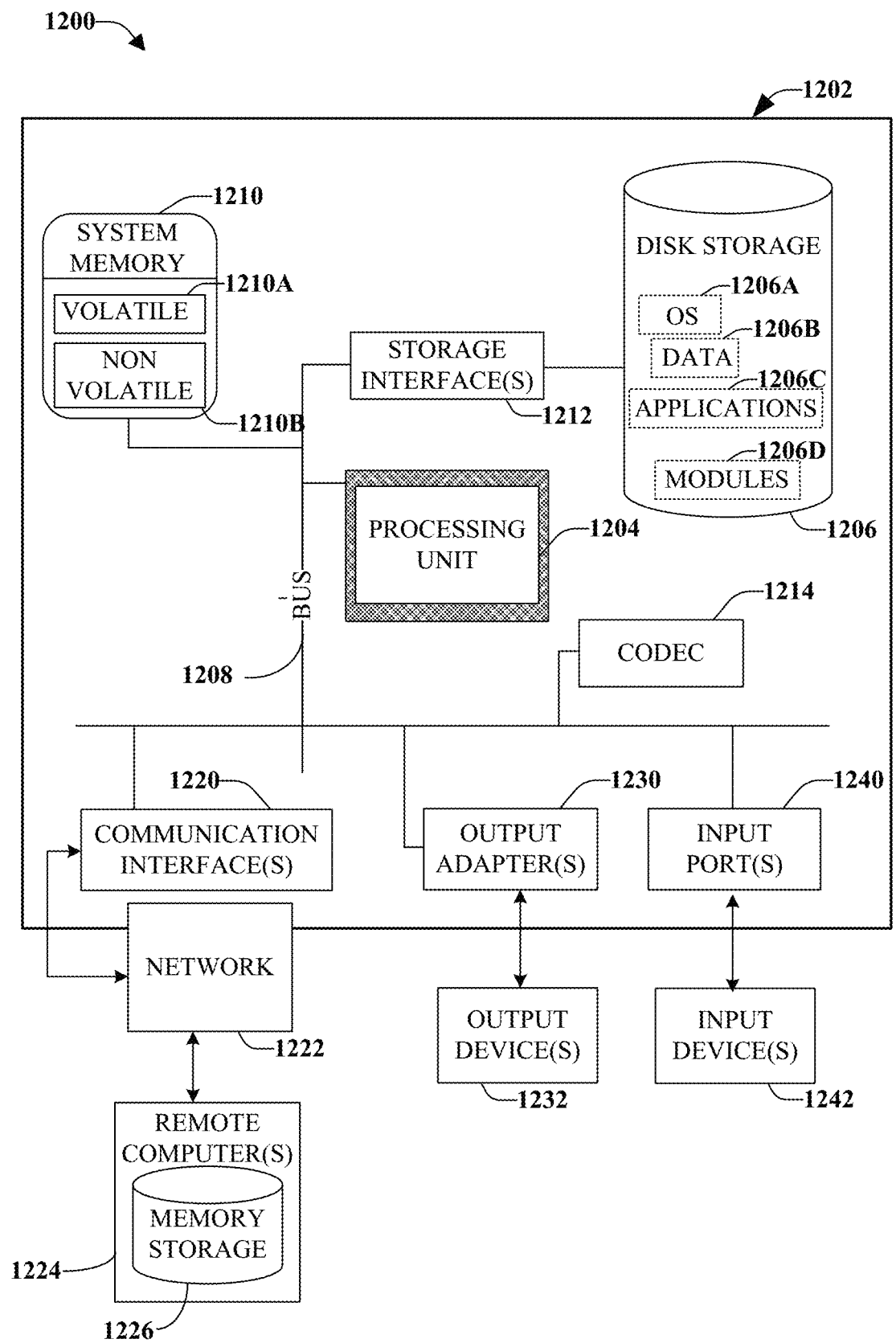
FIG. 12 illustrates a block diagram of an example computing environment for implementing one or more disclosed embodiments of the present disclosure.

In connection with FIG. 12, the systems, devices, and/or processes described herein can be embodied within hardware, such as a single integrated circuit (IC) chip, multiple ICs, an application specific integrated circuit (ASIC), or the like. Further, the order in which some or all of the process blocks appear in each process should not be deemed limiting. Rather, it should be understood that some of the process blocks can be executed in a variety of orders, not all of which may be explicitly illustrated herein.

With reference to FIG. 12, a suitable environment 1200 for implementing various aspects of the claimed subject matter includes a computer 1202. The computer 1202 includes a processing unit 1204, a system memory 1210, a codec 1214, and a system bus 1208. The system bus 1208 couples system components including, but not limited to, the system memory 1210 to the processing unit 1204. The processing unit 1204 can be any of various available processors. Dual microprocessors and other multiprocessor architectures also can be employed as the processing unit 1204.

The system bus 1208 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 1394), and Small Computer Systems Interface (SCSI).

The system memory 1210 includes volatile memory 1210A and non-volatile memory 1210B. The basic input/output system (BIOS), containing the basic routines to transfer information between elements within the computer 1202, such as during start-up, is stored in non-volatile memory 1210B. In addition, according to present innovations, codec 1214 may include at least one of an encoder or decoder, wherein the at least one of an encoder or decoder may consist of hardware, software, or a combination of hardware and software. Although, codec 1214 is depicted as a separate component, codec 1214 may be contained within non-volatile memory 1210B. By way of illustration, and not limitation, non-volatile memory 1210B can include read only memory (ROM), programmable ROM (PROM), electrically programmable ROM (EPROM), electrically erasable programmable ROM (EEPROM), or flash memory, two-terminal memory, and so on. Volatile memory 1210A includes random access memory (RAM), and in some embodiments can embody a cache memory. By way of illustration and not limitation, RAM is available in many forms such as static RAM (SRAM), dynamic RAM (DRAM), synchronous DRAM (SDRAM), double data rate SDRAM (DDR SDRAM), and enhanced SDRAM (ESDRAM).

Computer 1202 may also include removable/non-removable, volatile/non-volatile computer storage medium. FIG. 12 illustrates, for example, disk storage 1206. Disk storage 1206 includes, but is not limited to, devices like a magnetic disk drive, solid state disk (SSD) floppy disk drive, tape drive, Jaz drive, Zip drive, LS-100 drive, flash memory card, or memory stick. In addition, disk storage 1206 can include storage medium separately or in combination with other storage medium including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 1206 to the system bus 1208, a removable or non-removable interface is typically used, such as storage interface 1212. It is appreciated that storage devices 1206 can store information related to a user. Such information might be stored at or provided to a server or to an application running on a user device. In one embodiment, the user can be notified (e.g., by way of output device(s) 1232) of the types of information that are stored to disk storage 1206 or transmitted to the server or application. The user can be provided the opportunity to opt-in or opt-out of having such information collected and/or shared with the server or application (e.g., by way of input from input device(s) 1242).

It is to be appreciated that FIG. 12 describes software that acts as an intermediary between users and the basic computer resources described in the suitable operating environment 1200. Such software includes an operating system 1206A. Operating system 1206A, which can be stored on disk storage 1206, acts to control and allocate resources of the computer system 1202. Applications 1206C take advantage of the management of resources by operating system 1206A through program modules 1206D, and program data 1206D, such as the boot/shutdown transaction table and the like, stored either in system memory 1210 or on disk storage 1206. It is to be appreciated that the claimed subject matter can be implemented with various operating systems or combinations of operating systems.

A user enters commands or information into the computer 1202 through input device(s) 1242. Input devices 1242 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1204 through the system bus 1208 via input port(s) 1240. Input port(s) 1240 include, for example, a serial port, a parallel port, a game port, and a universal serial bus (USB). Output device(s) 1232 use some of the same type of ports as input device(s) 1242. Thus, for example, a USB port may be used to provide input to computer 1202 and to output information from computer 1202 to an output device 1232. Output adapter 1230 is provided to illustrate that there are some output devices 1232 like monitors, speakers, and printers, among other output devices 1232, which require special adapters. The output adapters 1230 include, by way of illustration and not limitation, video and sound cards that provide a means of connection between the output device 1232 and the system bus 1208. It should be noted that other devices and/or systems of devices provide both input and output capabilities such as remote computer(s) 1238.

Computer 1202 can operate in a networked environment using logical connections to one or more remote computers, such as remote computer(s) 1224. The remote computer(s) 1224 can be a personal computer, a server, a router, a network PC, a workstation, a microprocessor based appliance, a peer device, a smart phone, a tablet, or other network node, and typically includes many of the elements described relative to computer 1202. For purposes of brevity, only a memory storage device 1226 is illustrated with remote computer(s) 1224. Remote computer(s) 1224 is logically connected to computer 1202 through a network 1222 and then connected via communication interface(s) 1220. Network 1222 encompasses wire or wireless communication networks such as local-area networks (LAN) and wide-area networks (WAN) and cellular networks. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL).

Communication interface(s) 1220 refers to the hardware/software employed to connect the network 1222 to the bus 1208. While communication interface(s) 1220 is shown for illustrative clarity inside computer 1202, it can also be external to computer 1202. The hardware/software necessary for connection to the network 1222 includes, for exemplary purposes only, internal and external technologies such as, modems including regular telephone grade modems, cable modems and DSL modems, ISDN adapters, and wired and wireless Ethernet cards, hubs, and routers.

The illustrated aspects of the disclosure may also be practiced in distributed computing environments where certain tasks are performed by remote processing devices that are linked through a communications network. In a distributed computing environment, program modules or stored information, instructions, or the like can be located in local or remote memory storage devices.

Moreover, it is to be appreciated that various components described herein can include electrical circuit(s) that can include components and circuitry elements of suitable value in order to implement the embodiments of the subject disclosure. Furthermore, it can be appreciated that many of the various components can be implemented on one or more IC chips. For example, in one embodiment, a set of components can be implemented in a single IC chip. In other embodiments, one or more of respective components are fabricated or implemented on separate IC chips.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In this regard, it will also be recognized that the embodiments include a system as well as a computer-readable medium having computer-executable instructions for performing the acts and/or events of the various processes.

In addition, while a particular feature may have been disclosed with respect to only one of several implementations, such feature may be combined with one or more other features of the other implementations as may be desired and advantageous for any given or particular application. Furthermore, to the extent that the terms "includes," and "including" and variants thereof are used in either the detailed description or the claims, these terms are intended to be inclusive in a manner similar to the term "comprising".

As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Further embodiments can be envisioned to one of ordinary skill in the art after reading this disclosure. For example, in various embodiments, erase operations may be initiated upon a plurality of ReRAM devices (e.g., 16, 32, etc.) at the same time.

In other embodiments, combinations or sub-combinations of the above disclosed embodiments can be advantageously made. The block diagrams of the architecture and flow charts are grouped for ease of understanding. However, it should be understood that combinations of blocks, additions of new blocks, re-arrangement of blocks, and the like are contemplated in alternative embodiments of the present disclosure.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A circuit, comprising:
    an array of non-volatile memory, the array further comprising:
        a first electrical line connected to a first terminal of a first non-volatile memory cell of the array;
        a second electrical line connected to a first terminal of a second non-volatile memory cell of the array;
        a switching circuit connected to a second terminal of the first non-volatile memory cell and connected to a second terminal of the second non-volatile memory cell;
        a third electrical line connected to the switching circuit for selectively connecting or disconnecting the second terminals to a low voltage, or ground;
    a programming power source configured to supply an electrical power signal for the array of non-volatile memory; and
    a controller configured to execute a program operation on the first non-volatile memory cell and on the second non-volatile memory cell, wherein the program operation comprises:
        connect the first and second electrical lines to the programming power source;
        supply the electrical power signal at the programming power source for a program cycle duration;
        activate the third electrical line and connect the second terminals to the low voltage, or ground; and
        maintain the electrical power signal at the programming power source for the program cycle duration, wherein in response to a program event that increases electrical conductivity of the first non-volatile memory cell, a program voltage across the second non-volatile memory cell in response to the programming signal is reduced in magnitude.

2. The circuit of claim 1, wherein:
    in response to a deactivation signal applied to the third electrical line the switching circuit isolates the second terminal of the first non-volatile memory cell and the second terminal of the second non-volatile memory cell from the low voltage, or ground; and
    in response to an activation signal applied to the third electrical line the switching circuit connects the second terminal of the first non-volatile memory cell and the second terminal of the second non-volatile memory cell to the low voltage, or ground.

3. The circuit of claim 1, wherein the first electrical line is a first bitline of the array, the second electrical line is a second bitline of the array and the third electrical line is a wordline of the array.

4. The circuit of claim 1, wherein the array of non-volatile memory is a memory technology selected from a group consisting of: a resistive switching memory, a conductive-bridging memory, a phase-change memory, an organic memory, a magneto-resistive memory, a resistive random access memory and a two-terminal memory.

5. The circuit of claim 1, wherein the first non-volatile memory cell and the second non-volatile memory cell define a physical unclonable function (PUF) bit.

6. The circuit of claim 5, wherein the controller defines the PUF bit as having a set state in response to the program event of the first non-volatile memory cell, and is configured to define the PUF bit as having a reset state in response to the program event occurring for the second non-volatile memory cell instead of for the first non-volatile memory cell.

7. The circuit of claim 5, wherein the controller is further configured to designate either the first non-volatile memory cell or the second non-volatile memory cell as containing a stored value, or a stored inverted value, of the PUF bit after the program operation.

8. The circuit of claim 1, further comprising a detection and path disconnection circuit, the detection circuit comprising:
    a first comparator having an input coupled to the second electrical line, a reference input and an output connected to a switch selectively connecting or disconnecting the first electrical line with the programming power source; and
    a second comparator having an input coupled to the first electrical line, a reference input and an output connected to a second switch selectively connecting or disconnecting the second electrical line with the programming power source; wherein:
        in response to the program event of the first non-volatile memory cell, the output of the second comparator connected to the second switch disconnects the second electrical line from the programming power source and isolates the electrical power signal from the second electrical line and from the second non-volatile memory cell; and
        in response to a program event of the second non-volatile memory cell, the output of the first comparator connected to the first switch disconnects the first electrical line from the programming power source and isolates the electrical power signal from the first electrical line and from the first non-volatile memory cell.

9. The circuit of claim 8, further comprising:
a first pull-down circuit that selectively connects or disconnects the first electrical line to a path to ground by way of a first pull-down switch, wherein the first pull-down switch is connected to the output of the first comparator; and
a second pull-down circuit that selectively connects or disconnects the second electrical line to a second path to ground by way of a second pull-down switch, wherein the second pull-down switch is connected to the output of the second comparator, wherein:
in response to the program event of the second non-volatile memory cell, the output of the first comparator closes the first pull-down switch and connects the first electrical line to ground by way of the path to ground; and
in response to the program event of the first non-volatile memory cell, the output of the second comparator closes the second pull-down switch and connects the second electrical line to ground by way of the second path to ground.

10. The circuit of claim 9, wherein:
the first electrical line is a first bitline of the array connected to the first terminal of the first non-volatile memory cell, the switch selectively disconnects the first bitline from the programming power source, and the first pull-down switch selectively connects the first bitline to the path to ground in response to the output of the first comparator; and
the second electrical line is a second bitline of the array connected to the first terminal of the second non-volatile memory cell, the second switch selectively disconnects the second bitline from the programming power source, and the second pull-down switch selectively connects the second bitline to the second path to ground in response to the output of the second comparator.

11. A method of operating a circuit, comprising:
connecting a first electrode of a first non-volatile memory cell to a power source;
connecting a first electrode of a second non-volatile memory cell to the power source;
connecting second electrodes of the first non-volatile memory cell and of the second non-volatile memory cell to a common node;
applying a program signal to the power source and connecting the common node to low voltage, or ground;
in response to a program event occurring at the first non-volatile memory cell, intrinsically suppressing the program signal at the second non-volatile memory cell; and
disconnecting the program signal from the power source.

12. The method of claim 11, further comprising maintaining the program signal at the power source for a duration of a program cycle before disconnecting the program signal from the power source.

13. The method of claim 12, wherein connecting the first electrode of the second non-volatile memory cell to the power source further comprises connecting an electrical line of an array of non-volatile memory to the power source, wherein the electrical line is coupled to the first electrode of the second non-volatile memory cell, and further comprising:
detecting the program event occurring at the first non-volatile memory cell prior to the duration of the program cycle.

14. The method of claim 13, further comprising disconnecting the first electrical line and the first electrode of the second non-volatile memory cell from the power source in response to detecting the program event occurring at the first non-volatile memory cell.

15. The method of claim 13, further comprising connecting the first electrical line to a path to ground in response to detecting the program event occurring at the first non-volatile memory cell.

16. The method of claim 11, further comprising defining the first non-volatile memory cell and the second non-volatile memory cell as a single physical unclonable function (PUF) bit.

17. The method of claim 16, further comprising defining a value of the PUF bit as either a program state or as an erase state in response to the program event.

18. The method of claim 17, further comprising designating a first of: the first non-volatile memory cell or the second non-volatile memory cell, as storing the value, or an inversion of the value, of the PUF bit.

19. The method of claim 18, further comprising designating a second of: the first non-volatile memory cell or the second non-volatile memory cell, for a non-PUF operation selected from a group consisting of: many-time programmable operation, one-time programmable operation and random number generation operation.

20. The method of claim 11, further comprising reinforcing the program event occurring at the first non-volatile memory cell with a one-time programmable program operation.

* * * * *